US012149209B2

(12) United States Patent
Ghannouchi et al.

(10) Patent No.: US 12,149,209 B2
(45) Date of Patent: Nov. 19, 2024

(54) HIGH EFFICIENCY ULTRA-WIDEBAND AMPLIFIER

(71) Applicant: Fadhel M Ghannouchi, Calgary (CA)

(72) Inventors: Fadhel M. Ghannouchi, Calgary (CA); Mohammadhassan Akbarpour, Calgary (CA); Mohamed Helaoui, Calgary (CA); Yulong Zhao, Calgary (CA); Dawood Shekari Beyragh, Calgary (CA); Xiang Li, Calgary (CA)

(*) Notice: Subject to any disclaimer, the term of this patent is extended or adjusted under 35 U.S.C. 154(b) by 586 days.

(21) Appl. No.: 17/335,072

(22) Filed: Jun. 1, 2021

(65) Prior Publication Data

US 2021/0351746 A1   Nov. 11, 2021

Related U.S. Application Data

(63) Continuation-in-part of application No. 16/180,072, filed on Nov. 5, 2018, now Pat. No. 11,025,202, which is a continuation of application No. 15/226,554, filed on Aug. 2, 2016, now Pat. No. 10,122,334, which is a continuation of application No. PCT/CA2014/000085, filed on Feb. 6, 2014.

(51) Int. Cl.
| | |
|---|---|
| *H03F 1/07* | (2006.01) |
| *H03F 1/02* | (2006.01) |
| *H03F 1/22* | (2006.01) |
| *H03F 1/32* | (2006.01) |
| *H03F 1/56* | (2006.01) |
| *H03F 3/193* | (2006.01) |
| *H03F 3/195* | (2006.01) |
| *H03F 3/21* | (2006.01) |
| *H03F 3/26* | (2006.01) |
| *H03F 3/30* | (2006.01) |

(52) U.S. Cl.
CPC ........ *H03F 1/0211* (2013.01); *H03F 1/0261* (2013.01); *H03F 1/0288* (2013.01); *H03F 1/223* (2013.01); *H03F 1/3205* (2013.01); *H03F 1/3217* (2013.01); *H03F 1/56* (2013.01); *H03F 3/193* (2013.01); *H03F 3/195* (2013.01); *H03F 3/21* (2013.01); *H03F 3/211* (2013.01); *H03F 3/26* (2013.01); *H03F 3/265* (2013.01); *H03F 3/3028* (2013.01); *H03F 2200/222* (2013.01); *H03F 2200/387* (2013.01); *H03F 2200/451* (2013.01); *H03F 2200/534* (2013.01); *H03F 2200/541* (2013.01); *H03F 2200/555* (2013.01)

(58) Field of Classification Search
CPC ..................................... H03F 1/02; H03F 1/07
USPC .............................................. 330/295, 124 R
See application file for complete search history.

(56) References Cited

U.S. PATENT DOCUMENTS

| | | | |
|---|---|---|---|
| 7,161,433 B2* | 1/2007 | Ueda ....................... | H03F 3/602 330/307 |
| 7,456,691 B2* | 11/2008 | Minichshofer ........... | H03F 1/34 330/311 |
| 2009/0167440 A1* | 7/2009 | Reis ........................ | H03F 1/223 330/311 |

* cited by examiner

*Primary Examiner* — Henry Choe

(57) ABSTRACT

An amplifier comprising a main branch amplifier and an auxiliary branch amplifier, wherein one branch is a constant current-biased branch, and another branch is a voltage biased branch, with the branches connected in cascode configuration to form a load modulated amplifier.

11 Claims, 30 Drawing Sheets

THE DOHERTY AMPLIFIER

PUSH-PULL AMPLIFIER WITH
DIFFERENT TRANSISTOR TYPESS
(PRIOR ART)

PUSH-PULL AMPLIFIER WITH
THE SAME TRANSISTOR TYPES
AND USING TRANSFORMERS

HIGH EFFICIENCY ULTRA-WIDEBAND AMPLIFIER

FIELD OF THE DISCLOSURE

The present matter relates generally to signal amplifiers and more specifically to wide bandwidth and high efficiency power amplifiers for radio frequency (RF) applications.

BACKGROUND

An ever-increasing demand, primarily by consumers, for higher data rates and higher quality wireless communication systems results in new and continuously developing standards. This compels wireless network operators and service providers to install new or upgraded infrastructures to accommodate these better service standards. Hardware in general is a more expensive component of the wireless communications infrastructure as compared to software with a result that hardware upgrades are more expensive compared to software upgrades. One-way to mitigate this is to have hardware that can work efficiently over a large frequency bandwidth and therefore accommodate the ever-increasing data rate and quality standards and thereby less frequent upgrades.

From a consumer's perspective mobile terminals or user equipment should also be able to operate in several frequency bands so that they can work with different standards. Furthermore, having mobile terminals with wideband hardware makes them usable in more operator networks and more countries around the world. Having wideband hardware also provides the capability of using the same terminal for different applications in a system.

A common component in wireless communications systems that may benefit from having a wide operating bandwidth is the radio frequency (RF) power amplifier, which delivers (in a wireless transmitter) a high frequency signal with a required RF power to the antenna.

Furthermore, since the energy for the RF power amplifier to drive a load is generated by a power supply, the average efficiency (defined as the ratio of the average output power to the average supply DC power) is to be considered in power amplifier design. In base stations, high efficiency power amplifiers translate into lower energy cost for operating the power amplifier as well as lower energy consumption by cooling systems, which are typically used with high power amplifiers in base stations. In the case of mobile terminals, a high efficiency power amplifier results in longer battery life.

To achieve higher data rates, standards implement complex modulation and multiplexing schemes such as quadrature amplitude modulation (QAM), orthogonal frequency division multiplexing (OFDM), and other multi-carrier schemes. These signals present high spectrum efficiency, but they also have high peak-to-average power ratio (PAPR). This means that the power amplifier is required to manage signals with a large time varying envelope. Such high values of PAPR implies that the amplifiers operates mostly at an average output power that is much lower (back-off condition) than its attainable saturated output power, which reduces the overall efficiency.

Designing high efficiency power amplifiers for high PAPR signals in a wide frequency band is challenging. The active device, typically a transistor is subject to various electrical constraints on its performance. Different topologies of active devices have been implemented to mitigate constraints on the individual active devices. Well-known power amplification topologies that provide high efficiency for high PAPR signals are for example, load-modulated amplifiers (such as the Doherty Power Amplifier), outphasing amplifiers and push pull amplifiers. Amplifiers are classified according to their circuit configurations and mode of operation and are designated by different classes of operation such as class "A", class "B", class "C", class "AB", etc. These different amplifier classes range from a near linear output but with low efficiency to a non-linear output but with a high efficiency. Each of these classes has a different bias point or position of the Q point for operating the amplifier. In order for the active devices to operate efficiently in a particular topology, appropriate bias conditions must be defined for the device. Transistors are usually biased using a constant voltage source.

The Doherty amplifier is an example of multi-branch amplifier topology composed of a main active device (commonly denoted as carrier amplifier) operating in class-AB providing signal amplification for all input signal levels, at least one auxiliary active device (commonly denoted as peaking amplifier) operating in class-C providing signal amplification starting from a predefined signal level, an input analog power divider for splitting the input signal between the carrier amplifier and the peaking amplifier, a non-isolated Doherty output power combiner for combining the outputs of the carrier amplifier and the peaking amplifier which includes quarter wavelength transformers, and 50 Ohms lines inserted at the input of the peaking amplifiers and/or carrier amplifier to balance the delay between the branches of the Doherty amplifier. However, Doherty amplifiers have limited operational bandwidth and are required to have quasi-open output impedance at the output of the peaking branch, which limits its operational bandwidth. The Doherty amplifier also needs impedance inverters, which cannot be implemented in very large bandwidth.

The outphasing amplifier topology splits an input signal into two constant envelope phase modulated signals that are amplified by high efficiency non-linear amplifiers and then combined at the output. However, the outphasing amplifier is also limited in bandwidth due to the narrow-band power combiner used in its structure.

The push-pull amplifier is another amplifier topology that has high peak energy efficiency. Push-pull amplifiers, utilize two transistors that are biased in class B (near the cut-off region). Each transistor works for half of the input signal cycle and delivers current to the load in the corresponding half cycle. To ensure proper on/off cycles, transistors of different types are needed in push-pull amplifier. For example, using bipolar technology, one of the transistors has to be of NPN type and the other transistor should be of PNP type. For FET transistors, one of the transistors has to be of N-channel type and the other transistor should be of P-channel type. In some applications two types of transistors cannot be used. If the same types of transistors are used in push-pull amplifier, one transformer is needed at the input of the amplifier and one transformer is needed at the output of the amplifier. Using transformers limit the operating frequency band of the amplifier and results in larger circuit size.

SUMMARY

The present matter relates to high efficiency ultra-wideband amplifiers.

In accordance with a general aspect of the present matter there is provided a biasing configuration for an active device that does not require the use of a bandwidth limiting circuit element in the signal path when the active device is incorporated into an amplifier topology.

Accordingly, there is provided in one aspect of the present matter a method for operating an amplifier over a wide bandwidth comprising: connecting an active device between a signal input and a signal output of the amplifier; connecting a bias source to bias the active device to operate the active device with an increasing output power with increasing load impedance.

In a further aspect the present matter provides an amplifier comprising an active device coupled at its outputs to drive a load, the load presenting a dynamic impedance to the device; and a biasing circuit configured to bias the active device to operate the active device so that an output power of the active device increases with increasing load impedance.

In accordance with a further aspect the active device is a transistor.

In accordance with a still further aspect the biasing circuit is a current source.

In a further aspect the amplifier is one of a multi-branch amplifier or push-pull amplifier.

In accordance with a further aspect the current source is coupled to provide bias for at least one transistor in the amplifier.

In a further aspect the present matter the amplifier is a push-pull amplifier utilizing a single type transistor.

In accordance with an aspect of the present matter there is provided a multiple branch amplifier wherein at least one branch of the multiple branch amplifier includes at least one current-biased transistor amplifier.

The multiple branch amplifier further includes an auxiliary transistor-based amplifier wherein the current-biased transistor amplifier in combination with the auxiliary amplifier enhances the efficiency of the multiple branch amplifier at large output power back-off levels over a multiple-octave frequency range.

In accordance with a further aspect, efficiency of the multiple branch amplifier is determined by the behavior of the current-biased main amplifier.

A further aspect provides for one or more transistor-based amplifiers for the auxiliary branches.

A further aspect provides for the auxiliary branch amplifier to be either voltage-biased or current-biased.

In accordance with a further embodiment of the present matter there is provided a method for a multiple branch amplifier the method comprising: applying sub signals of an input communications signal to respective inputs of respective branches of the multiple branch amplifier, each sub signal carries a portion of the input communication signal; and setting a relative phase of the sub signals to result in constructive power combination at outputs of the amplifier branches.

In accordance with a further aspect the method includes using a power divider and delay lines over an operating frequency range to generate the sub signals.

In accordance with a further aspect of the method, the divider and delay lines are used when the multiple branch amplifiers is operated as a single-input amplifier.

In accordance with a further aspect the method includes using base band signal delay algorithms to generate the sub signals.

In accordance with a further aspect of the method, the base band signal delay algorithms are used when the multiple branch amplifier is configured as a transmitter.

In accordance with a further aspect of the method the transmitter includes a baseband module; up-converter; and amplifier.

In another aspect the present matter further includes one or more bias feedback networks. The bias feedback network being used to stabilize or tune bias points of the transistor-based amplifier according to amplitude of the input sub signal.

In another aspect the present matter further includes an output network for converting the amplifier's output load impedance to an optimum output load impedances at output terminals of the amplifier branches.

In another aspect the present matter further includes an input network for converting the input communication signal source impedance to an optimum input source impedance at input terminals of the respective branches.

In another aspect the present matter the input network is used to split the input communication signal into sub signals between the respective branches.

In another aspect of the present matter the input network is a multi-port input network. In this case, the input communication signal is applied to the input of the multi-port input network.

In accordance with another aspect of the present matter there is provided a push-pull amplifier utilizing two transistors of the same type wherein one transistor is biased by a constant current source and the second transistor is biased by a constant voltage source.

In another aspect the present matter the push-pull amplifier further includes one or more input bias sources. The input bias sources may be used to reduce the distortions in the output signal.

In another aspect the present matter the push-pull amplifier further includes an input network for converting an input signal source impedance to an optimum input source impedance at the input terminal of the push-pull amplifier.

In another aspect the present matter the push-pull amplifier further includes an output network for converting the amplifier's output load impedance to an optimum output load impedance at the output terminal of the push-pull amplifier.

In another aspect the present matter the push-pull amplifier further includes one or more bias feedback networks. The bias feedback network may be used to stabilize or tune the bias points of the transistor-based amplifier according to the input signal amplitude.

In another aspect the present matter the push-pull amplifier further includes a switch circuit at the output terminal of the current-biased transistor. The switch circuit being used to prevent the output current of the voltage biased transistor from leaking into the current-biased transistor.

BRIEF DESCRIPTION OF THE DRAWINGS

The present disclosure will be better understood with reference to the drawings in which.

DETAILED DESCRIPTION OF THE PREFERRED EMBODIMENTS

The following preferred embodiments of the invention are provided and considered for discussion and clarification but are not intended to limit the scope of the invention, its application, or uses. Throughout the drawings like parts are indicated by like element numbers. In the description, two-branch and three-branch amplifiers are described as examples of multiple branch amplifiers. However, it should be understood that multiple branch amplifies with more than three branches may equally well be implemented in accordance with the principles taught herein. In a traditional voltage biased arrangement the power output by the active device is inversely related to the load impedance seen by the active device so with a dynamic load the voltage biased transistor drives an output power that is inversely proportional to changes in the load, whereas with a constant current source the output power of the active device into the load is directly proportional to changes in the load, so the output power increases (decreases) with increasing (decreasing) load. The behavior of current-biased active device differs from the behavior of voltage-biased active device. This behavior may for example be characterized in terms of load-line and current/voltage waveforms.

In one embodiment of the present matter the biasing circuit is a constant current source. In another embodiment the biasing circuit is a dynamic source for providing power to the active device so that the output power of the active device into the load is directly proportional to changes in the load.

Figure 1A:
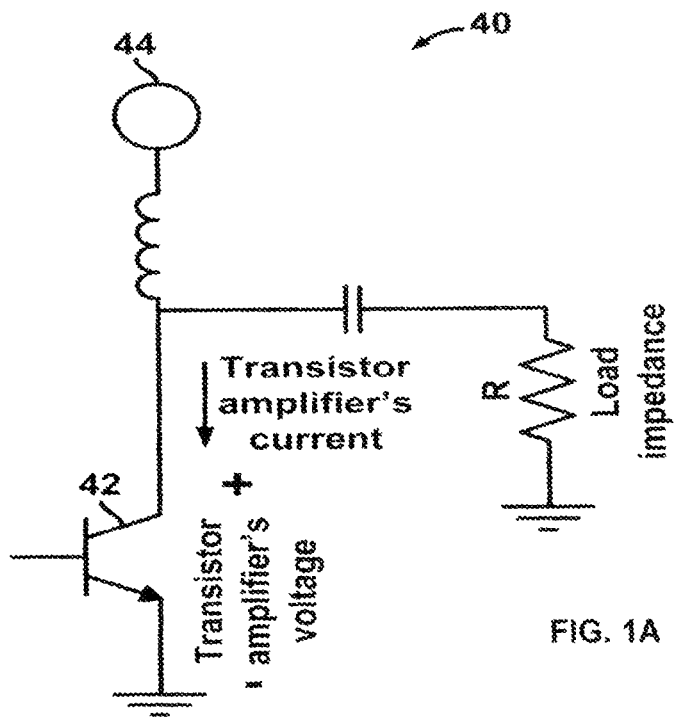
FIGS. 1A and 1B show a voltage-biased amplifier and load line characteristics for the amplifier.
Figure 1B:
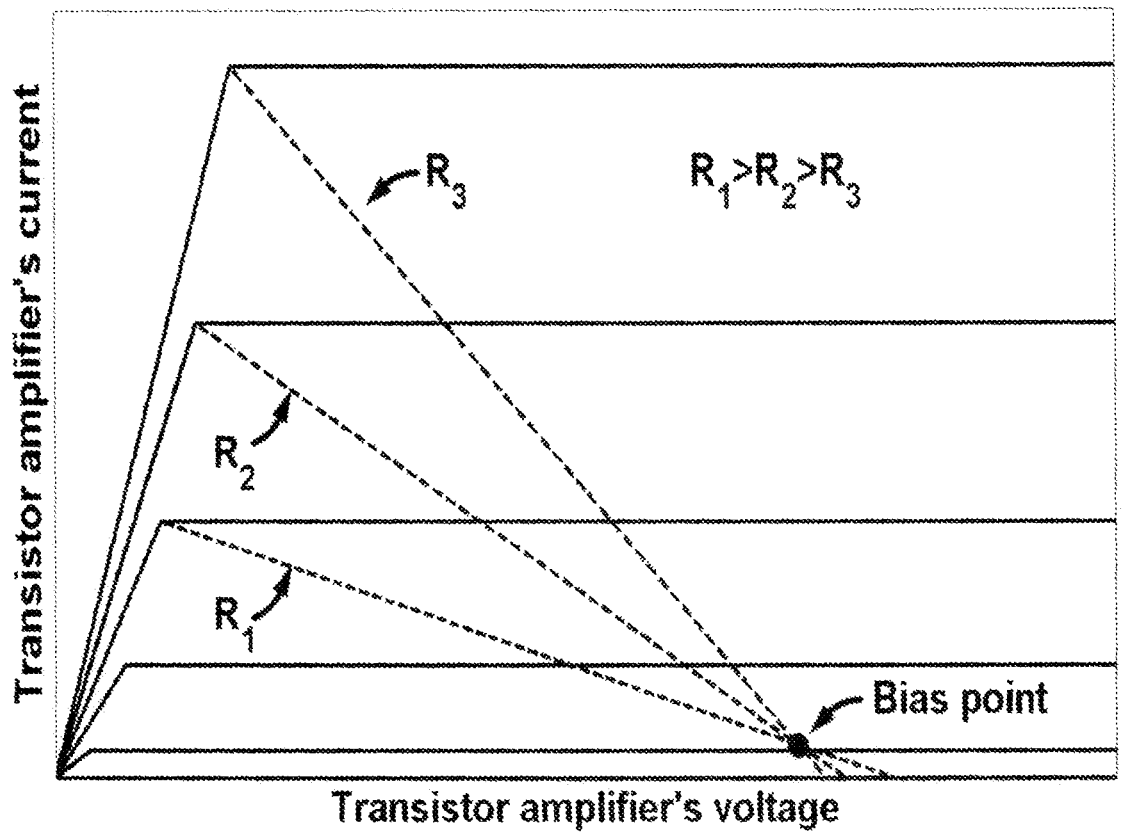

Referring to FIG. 1A where there is shown a circuit diagram of a typical amplifier 40. The amplifier 40 comprises a single active device 42 (in this case a BJT), voltage source 44 providing a bias voltage across the active device and a load R driven from the output of the active device 42. For a BJT for example FIG. 1B shows the load lines of the transistor when biased to operate in class AB. The load lines for different values of load resistance R are superposed on a graph of the amplifier bias current (Ic) versus collector-emitter voltage $V_{CE}$ (characteristic curves). The bias point is shown for the class AB voltage bias. As can be seen from FIG. 1B, maximum collector current swing for higher load impedances is lower than the current swing for lower load impedances. Accordingly, for higher load impedances the amplifier saturates at lower output power levels.

Figure 2:
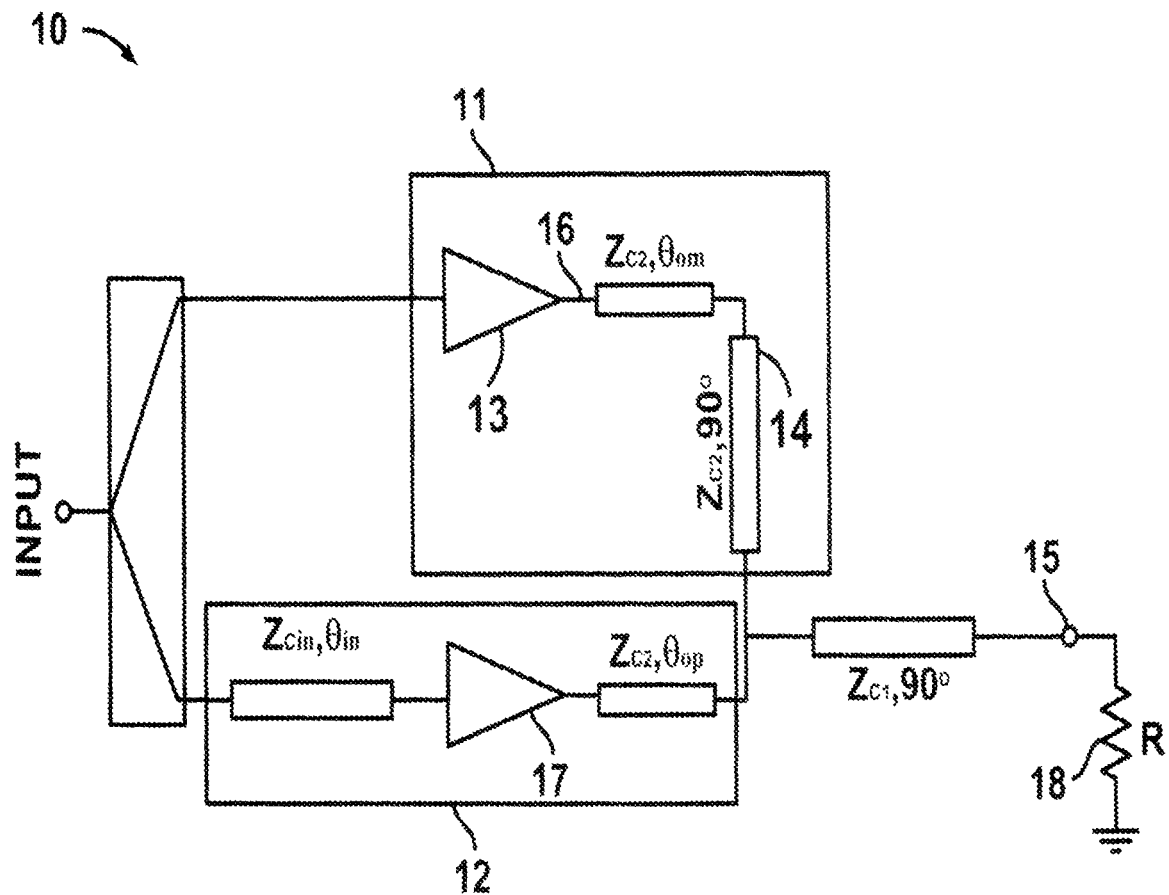
FIG. 2 shows a schematic circuit block diagram of a typical Doherty amplifier.

Power performance of an amplifier is mainly determined by load impedances presented to the active device. Multibranch amplifiers which use two or more active devices for example allow the load impedance to be varied with input drive level. For example, referring to FIG. 2 there is shown a topology 10 of a typical Doherty technique, which allows the load impedance to be modified with input drive level. The Doherty amplifier comprises a main branch 11 (with carrier amplifier 13) and auxiliary branch 12 (with peaking amplifier 17) connected together to drive a load resistance 18 connected to an output node 15. The Doherty amplifier decreases the load impedance as seen by the carrier amplifier 13 in the main branch such that the carrier amplifier 13 remains in saturation and provides higher efficiency in a larger output power range. When the auxiliary branch 12 delivers current to the output node 15, it increases the load impedance seen by the main branch 11. This effect is generally referred to as load modulation. In other words to maximize the efficiency of one device (i.e. Main) while its output load is changing (by the current supplied by the Auxiliary device), the voltage swing across it has to be maintained constant. In order to guarantee such a constraint, it is necessary to interpose an impedance-inverting network between the load (R) 18 and the Main amplifier 13.

The impedance inverter 14 (typically a quarter wavelength transmission line at the nominal operating frequency of the RF amplifier) used in the main branch 11 to invert the load modulation effect and obtain the decreasing load impedance needed at the amplifier's output node 16 is frequency dependent. The frequency dependent impedance inverter 14 limits the operational bandwidth of Doherty amplifier.

Figure 3A:
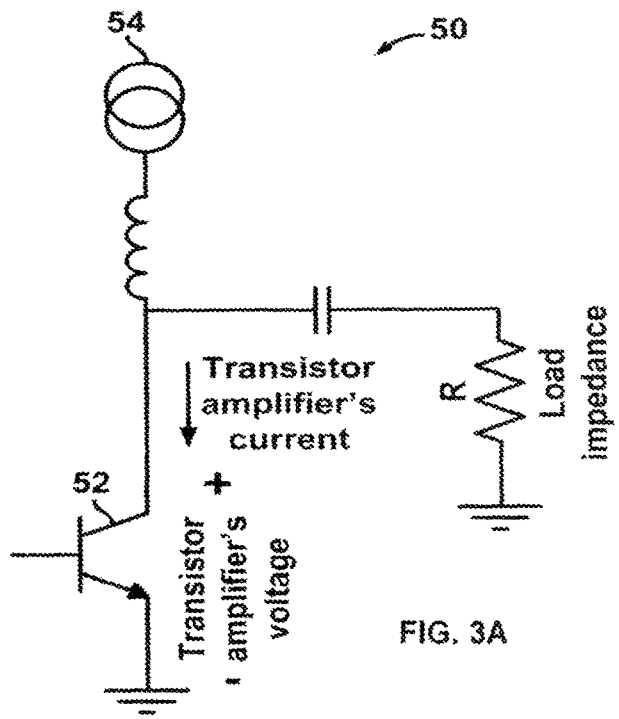
FIGS. 3A and 3B show a current-biased amplifier and load line characteristics for the amplifier.

Referring to FIG. 3A there is shown a schematic diagram 50 of an amplifier having a current source instead of a voltage source for biasing the active device according to an embodiment of the present matter. The amplifier 50 comprises a current source 54 coupled to the active device 52 (for example a BJT, FET, MOSFET, LDMOS etc) and a load impedance R driven by the active device 52. Referring to FIG. 3B there is shown the load lines of the current source biased amplifier 50. Using the current source for biasing, the amplifier saturates at lower output power for lower load impedance. As shown in FIG. 3B, for the lower load impedance of R1, maximum voltage swing is equal to V1-Vk. By increasing the load impedance to R2 and R3, maximum voltage swing is increased to V2-Vk and V3-Vk respectively. Maximum output power from the transistor is proportional to the value of maximum transistor's voltage swing. Thus it may be seen that with increasing load impedance, the maximum obtainable output power increases. This trend is the opposite to the voltage biasing case illustrated in FIG. 1. Therefore a consequence of using this type of biasing is that there is no need for the impedance inverter when adding auxiliary branches. The load modulation at the combining point (i.e. increasing load impedance with increasing auxiliary branch output current) is the same as that of the current-biased amplifier to remain in saturation and provide high efficiency. Consequently, proper load modulation at the output of the current-biased amplifier can be guaranteed in a large bandwidth without the need for frequency selective narrowband impedance inverters.

The above may be better understood by the below discussion wherein the characteristics of a current-biased N-channel FET transistor are explained to exemplify differences between a current biased transistor and a voltage-biased transistor. These characteristics apply to other transistors technologies and circuit topologies, such as BJT's, MOSFET, JFETS, LDMOS etc.

1. In a class B (or AB) biased voltage-biased N-channel FET, the (physical) channel inside transistor is pinched off and a low current flows inside transistor, but in the current-biased transistor, the channel is open and a high current flows into the transistor while the voltage is still low.
2. The output impedance of a voltage-biased transistor is high while the output impedance of the current-biased transistor is low.
3. The voltage-biased transistor's output (drain-source) model may be viewed, as a current source while the current-biased transistor model is a voltage source.
4. Following from points 2 and 3, the optimum load impedance for gain is high for voltage-biased transistors and the optimum load-impedance for current-biased transistor is low. This makes the transistor behave differently in terms of load impedance for small-signal operation.
5. For large signal operation, in a load-pull configuration, it may be seen by simulation (or measurement) that the behavior of the voltage-biased and current-biased transistors are different. For a voltage-biased transistor, optimum load impedance (for maximum output power and efficiency) increases with input power while the optimum load impedance (for maximum output power and efficiency) for current-biased transistor decreases with input power. This can also be more clearly seen from the inferred from the load lines in FIGS. 1B and 3B.
6. A class B voltage-biased transistor injects current into the load impedance in a positive half cycle of the input signal, but in a current-biased counterpart of a class B amplifier current is injected b the device into the load in the negative half-cycle of the input signal.

For a multi-branch amplifier with the auxiliary amplifier biased in class C (voltage biased), the main amplifier sees a low value of load impedance R1 (Referring to FIG. 3B) causing it to saturate at low power (voltage swing reaches a maximum voltage swing of V1-Vk and the current swing reaches its maximum of IQ). After this point, if the auxiliary amplifier is not present, the voltage and current waveforms are cut (clipped) and amplifier's gain will drop leading to gain compression. When the auxiliary amplifier turns on, it injects current into the load impedance RL. The first harmonic components of the main amplifier's output current and peaking amplifier's output current have the same phase resulting in their currents adding in-phase.

Figure 3C:
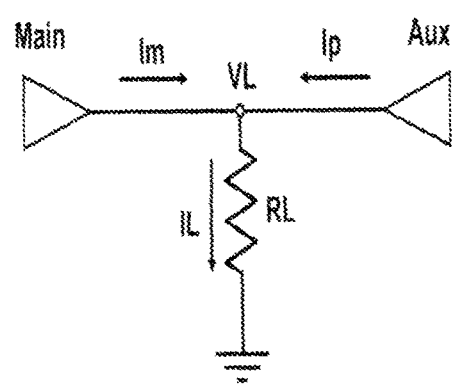
FIG. 3C shows a schematic circuit diagram of load modulation using the principle of load pulling with two active devices.
Figure 3B:
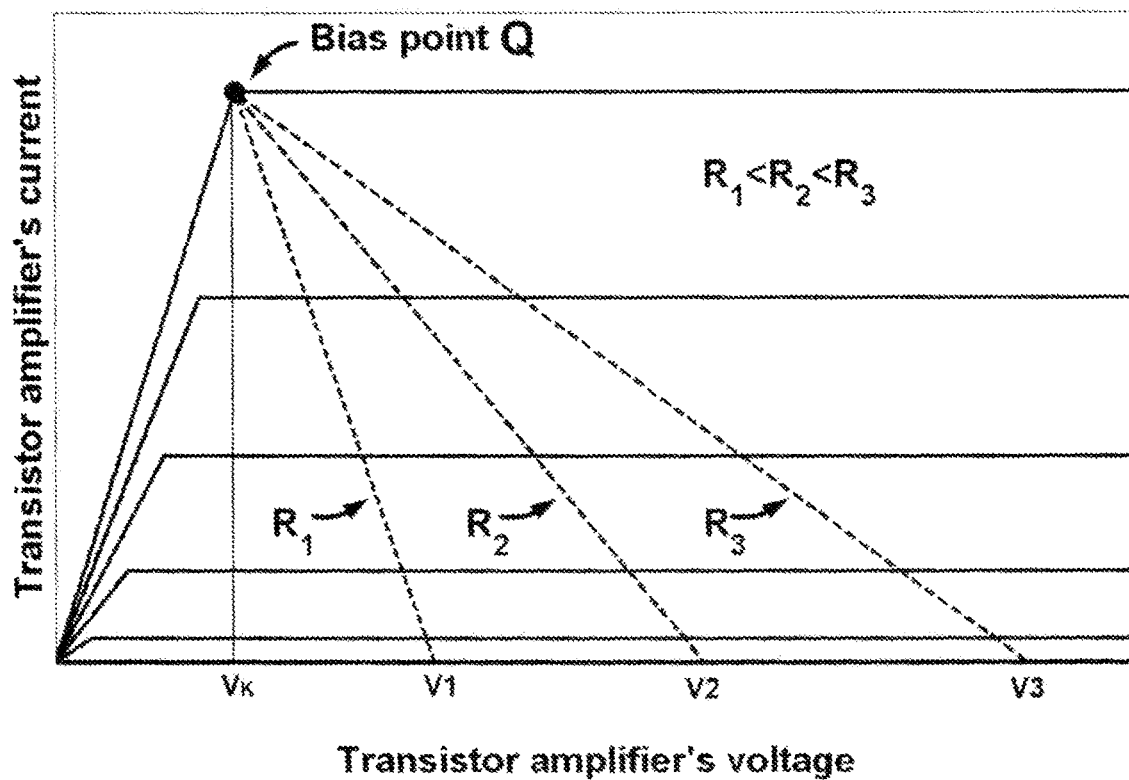

Referring to FIG. 3C, there is shown a schematic circuit diagram of load modulation using the principle of load pulling with two active devices. As may be seen the load impedance seen by the main amplifier is calculated as:

$$\text{It } R_{L,m} = \frac{V_L}{I_m} = \frac{R_L(I_m + I_p)}{I_m} = RL\left(1 + \frac{I_p}{I_m}\right) \quad (1)$$

Thus by increasing Ip/Im, the load seen by the main amplifier increases. When the load impedance increases, it may be seen from FIG. 3B, the current-biased transistor can have more voltage swing (V2-Vk for load impedance of R2 and V3-Vk for load impedance of R3). When the auxiliary amplifier delivers current to the load, the main amplifier can deliver more power to the load (due to increased voltage swing for the current-biased transistor). For the voltage-biased transistor, load impedance needs to be decreased to obtain more current swing, which contradicts, equation (1)

above. That is why an impedance inverter is needed for voltage-biased transistors (Doherty structure). However by using a current-biased transistor, no impedance inverter is needed because the need for the impedance to increase is met when the peaking amplifier turns on.

Figure 4:
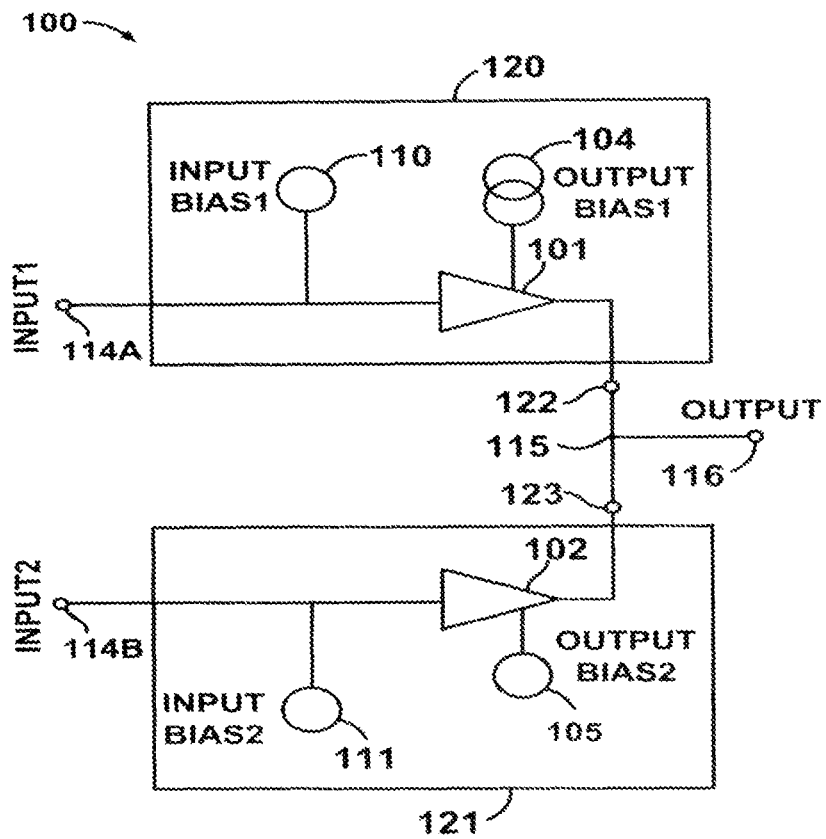
FIG. 4 is a simplified schematic block diagram of a multi-branch amplifier according to an exemplary embodiment of the present matter.

This use of current source instead of a voltage source for biasing the active device may be implemented in a variety of different amplifier topologies. For example, referring to FIG. 4 there is shown a schematic block diagram of a multi-branch amplifier 100 according to an embodiment of the present matter. The multi-branch amplifier 100 includes two branches, a main branch 120 and an auxiliary branch 121. The main branch 120 includes a transistor-based main amplifier 101 having an input terminal 114A and output terminal 122, a constant current source bias (also termed herein simply as a current bias) 104 connected to the output terminal of the main amplifier 101 and the auxiliary branch 121 includes a transistor-based auxiliary amplifier 102 also having an input terminal 114B and output terminal 123. The auxiliary amplifier 102 is biased through its output terminal by an output bias2 source 105. The output bias2 source 105 may be either a voltage source or a current source. Each branch also includes respective input bias sources, input bias1 110 and input bias2 111 for biasing the respective input terminals of the transistor-based amplifiers, 101, 102.

The output signals of the respective amplifiers 101 and 102 are combined at an output-combining node 115.

In other embodiments for example, the input biases 110 and 111 can be supplied from a single source rather than separate sources as illustrated.

In operation an input signal is applied to respective input port terminals input1 port 114A and input2 port 114B, of the respective amplifiers 101 and 102. The input signals from the input1 port 114A and input2 port 114B are amplified by amplifiers 101 and 102 respectively. The two amplified signals are combined at the output power-combining node 115. The combined output signals at the output power-combining node 115 are combined and fed to an output 116 of the multichannel amplifier 100.

When the power of the input signal increases, the output current from transistor-based auxiliary amplifier 102 increases the load impedance seen by the current biased transistor-based main amplifier 101. Referring to FIG. 3, this mechanism allows current biased transistor-based main amplifier 101 to remain in saturation over a wide power range without the need for any additional circuit elements.

At low input power levels, current source-biased transistor-based main amplifier 101 has almost constant optimum load impedance regardless of the frequency of operation. Presenting optimum load impedance to the transistor guarantees high energy efficiency for the transistor amplifier. As the input power goes up, the optimal load impedance varies along a trajectory that is almost insensitive to the change in frequency of operation. This can be inferred from the transistor-based amplifier's load line along with current/voltage curves or verified through load-pull simulation and measurements. These two features along with the fact that no additional circuit elements are needed for optimum load modulation distinguish current-biased devices from their voltage-biased counterparts, and greatly facilitate the design of the amplifier for operation over wide bandwidth and large output power range. The transistor-based auxiliary amplifier 102 is biased using output bias2 source 105. Output bias2 source 105 can be either a voltage source, or a current source.

Figure 5:
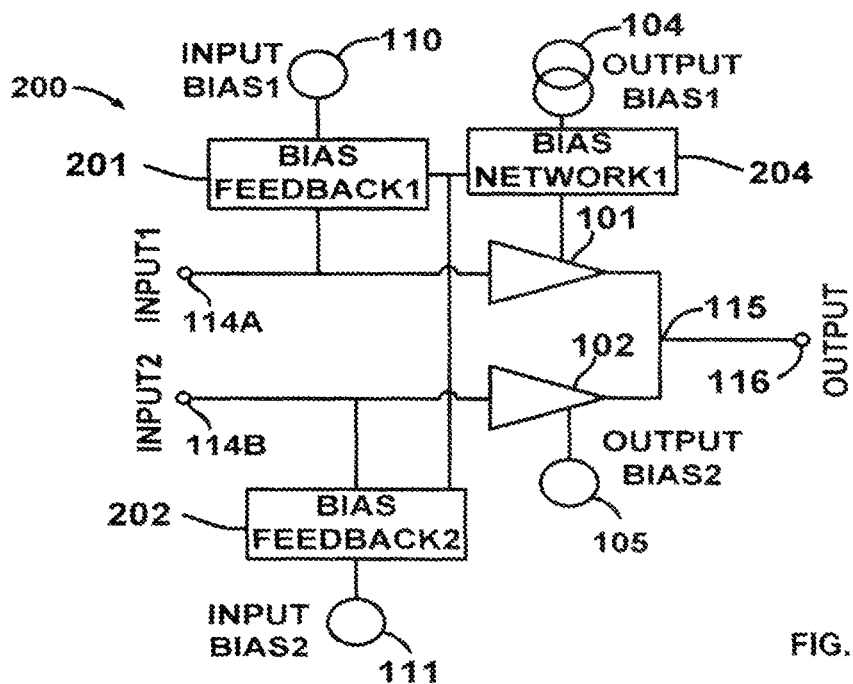
FIG. 5 shows a schematic block diagram of another embodiment of the present matter.

Referring to FIG. 5 there is shown a multi-branch amplifier 200 according to another embodiment of the present matter. The multi-branch branch amplifier 200 is similar to the embodiment of a two branch amplifier illustrated in FIG. 4 but with two additional bias feedback networks 201 and 202 connected between the respective input biases 110 and 111 and the respective input terminals 114A and 114B. Current-biased transistor-based main amplifier 101 has constant bias current. Its bias voltage, however, is dependent on the input power. Due to the amplifier's bias point, the voltage waveform at the output terminal of the main amplifier are half sine waves for a sinusoidal input signal. By increasing input power level, the amplitude of the half sine wave increases causing the average (DC) voltage on the main amplifier's output to increase. For amplitude-modulated signals, the bias voltage for current-biased transistor-based main amplifier 101 varies according to the envelope of the input signal. This varying voltage can be used for bias stabilization and input bias adaptation by using bias feedback networks 201 and 202. The input bias adaptation can be used to get more output power or for linearization of the whole amplifier. Bias feedback1 201 can also be used to avoid thermal runaway when biasing transistor-based main amplifier 101 using a current source. Bias network1 204 contains circuitry to provide the proper feedback to bias feedback networks 201 and 202. FIG. 5 is for illustration purpose and there may be variations in the amplifier implementation. For example, some branches may have bias feedback networks while the other branches may not have bias feedback network.

Figure 6:
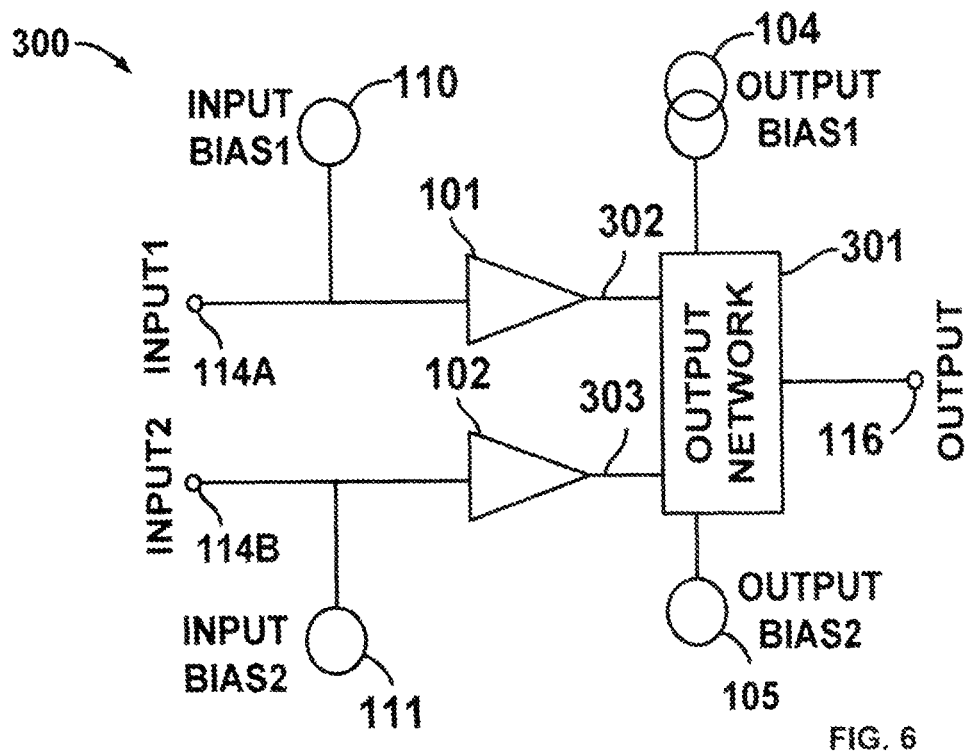
FIG. 6 shows a schematic block diagram of another embodiment of the present matter.
Figure 7:
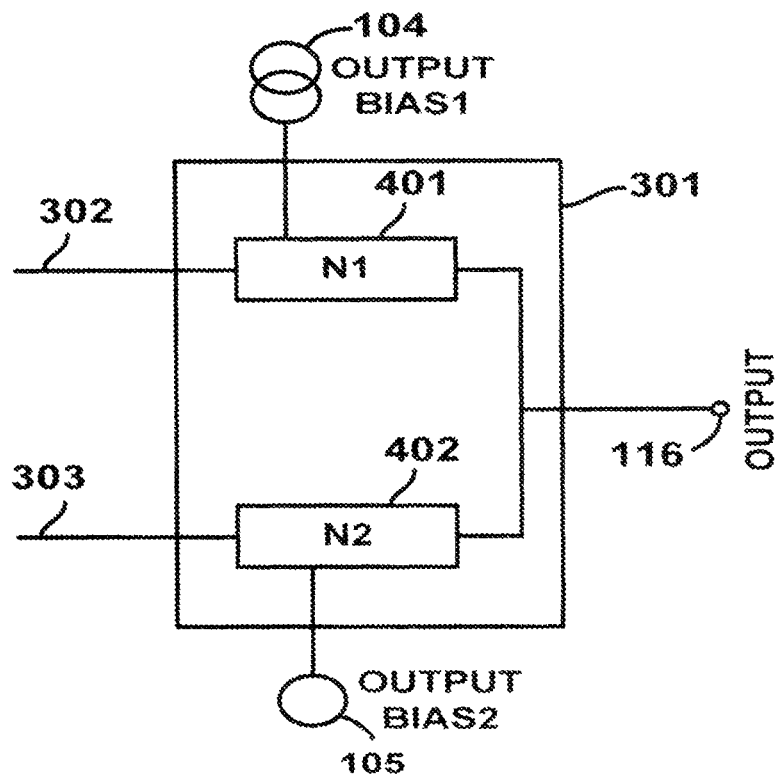
FIG. 7 shows a schematic block diagram of a multiple port output network.

FIG. 6 shows an exemplary embodiment of the current invention where a two-branch amplifier 300 is implemented with one output network 301. Output network 301 combines the output signals from transistor-based amplifiers 101 and 102. It also presents the appropriate load impedance at output terminals 302 and 303 of transistor-based amplifiers 101 and 102, respectively. The output network 301 can be implemented in various forms. One possible implementation of the output network 301 is shown in FIG. 7. In this implementation, the networks denoted by N1 and N2, 401 and 402 respectively provide the bias to the output nodes 302 and 303 of the transistor-based amplifiers 101 and 102 respectively. The networks N1 401 and N2 402 also convert the load impedance to the optimum impedances required at the two transistor-based amplifier output nodes 302 and 303 if impedance conversion is needed.

Figure 8:
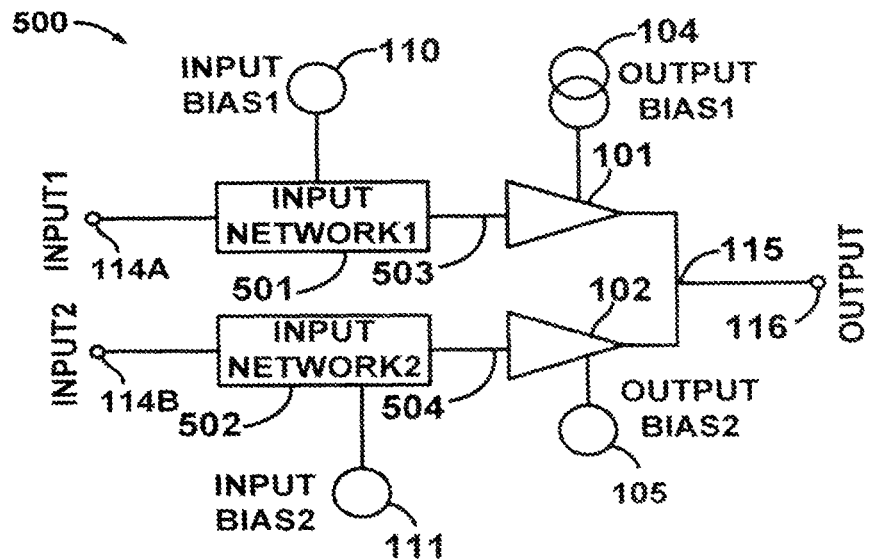
FIG. 8 shows a schematic block diagram of another embodiment of the present matter.

FIG. 8 shows an exemplary embodiment of the current invention where a two-branch amplifier 500 is implemented with two input networks 501 and 502. Input network1 501 and input network2 502 convert the source impedances to the optimum impedances required at the two transistor-based amplifier input nodes 503 and 504 respectively if impedance conversion is needed. FIG. 8 is for illustration purpose and there may be variations in the amplifier implementation. For example, some branches may have input network while the other branches may not have input network.

Figure 9:
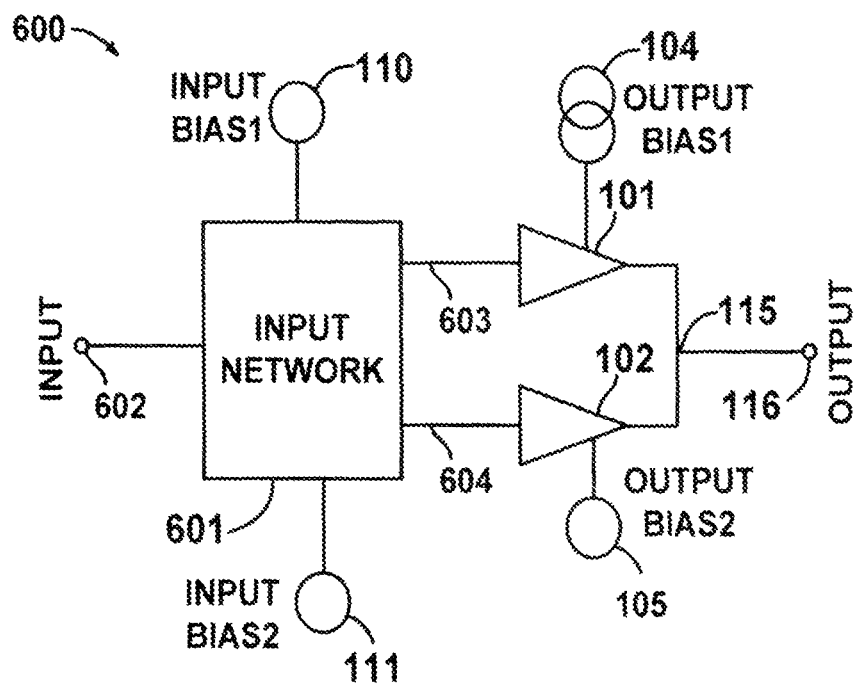
FIG. 9 shows a schematic block diagram of another embodiment of the present matter.
Figure 10:
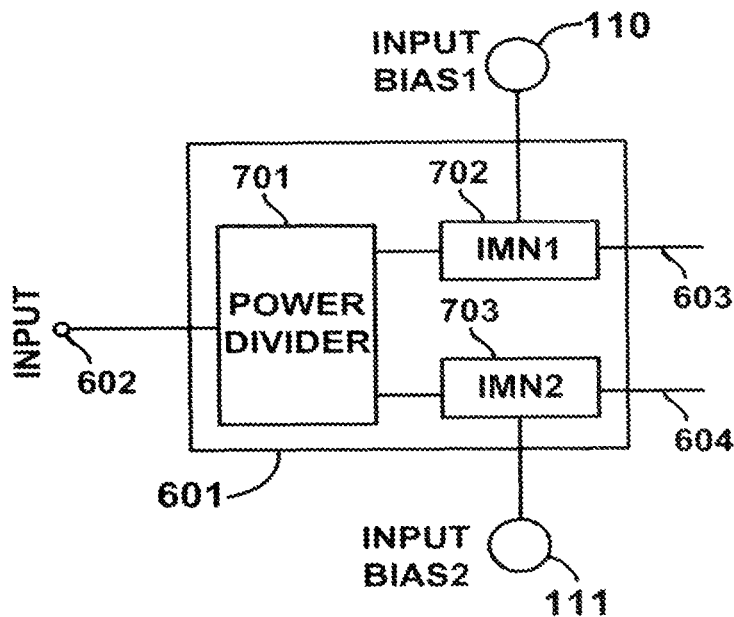
FIG. 10 shows a schematic block diagram of a multiple port input network.

FIG. 9 shows an exemplary embodiment of the current invention where a two-branch amplifier 600 is implemented with one multi-port input network 601. The multi-port input network 601 splits the input signal from the input port 602 between the two amplifier branches. The multi-port input network also converts the source impedance to the optimum impedances required at the two transistor-based amplifier input nodes 603 and 604 respectively if impedance conversion is needed. The input network 601 can be implemented in various forms. One possible implementation of the input network 601 is shown in FIG. 10. In this implementation, the power divider network 701 splits the input signal from the input port 602 between the two amplifier branches. IMN1 network 702 and IMN2 network 703 then provide the optimum source impedance to the transistor-based amplifier input terminals 603 and 604.

Figure 11:
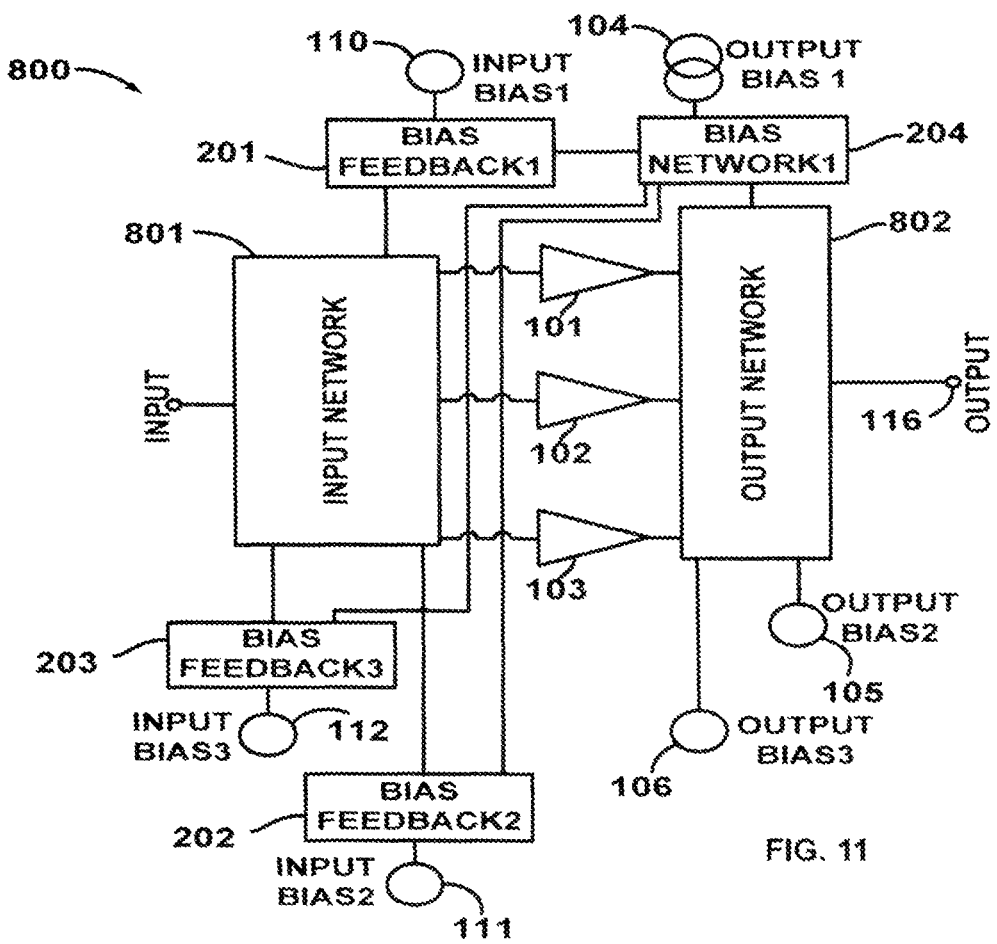
FIG. 11 shows a schematic block diagram of another embodiment of the present matter.

To extend the power range at which the amplifier presents high efficiency, the number of amplifier branches can be increased. In this case, one of the branches should be biased using a current source and the other branches can be biased with either voltage or current sources. FIG. 11 shows an exemplary embodiment of the current invention where a three-branch amplifier 800 has one current-biased transistor-based main amplifier 101 and two transistor-based auxiliary amplifiers 102 and 103. The output bias2 105, output bias3 106 and input biases 110, 111 and 112 can be supplied using a single or multiple source(s). Having two transistor-based auxiliary amplifiers 102 and 103 results in high efficiency at larger output power back-off range. Accordingly, this embodiment of the present invention enables higher efficiency for signals having larger values of PAPR.

The transistor-based amplifiers 101, 102 and 103 shown in FIG. 4 to FIG. 11 can be implemented using any of the technologies that can be used for transistor amplifier design. Some exemplary technologies that can be used for designing the transistor-based amplifiers 101, 102 and 103 are the Field-Effect Transistors (FET), Bipolar Junction Transistors (BJT), Hetero-junction Bipolar Transistors (HBT) or High Electron Mobility Transistors (HEMT). Any other technologies that are used to make electrical amplifiers can be also used in designing transistor-based amplifiers 101, 102 and 103.

The transistor-based amplifiers 101, 102 and 103 shown in FIG. 4 to FIG. 11 can be implemented using different topologies used in transistor amplifier designs. Some exemplary topologies that can be used to design transistor-based amplifiers 101, 102 and 103 are the common-source, common-gate, common emitter, common-base and cascode amplifiers. These are examples of the topologies that can be used as the transistor-based amplifiers 101, 102 and 103 and the topologies are not limited to these cases.

Figure 12A:
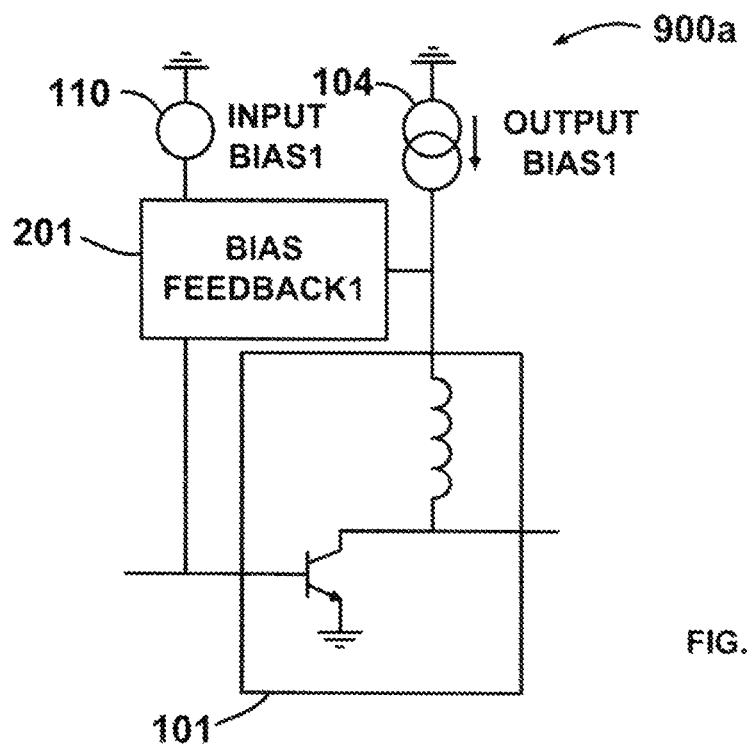
FIG. 12A shows a schematic block diagram of a current-biased transistor-based amplifier branch.
Figure 12B:
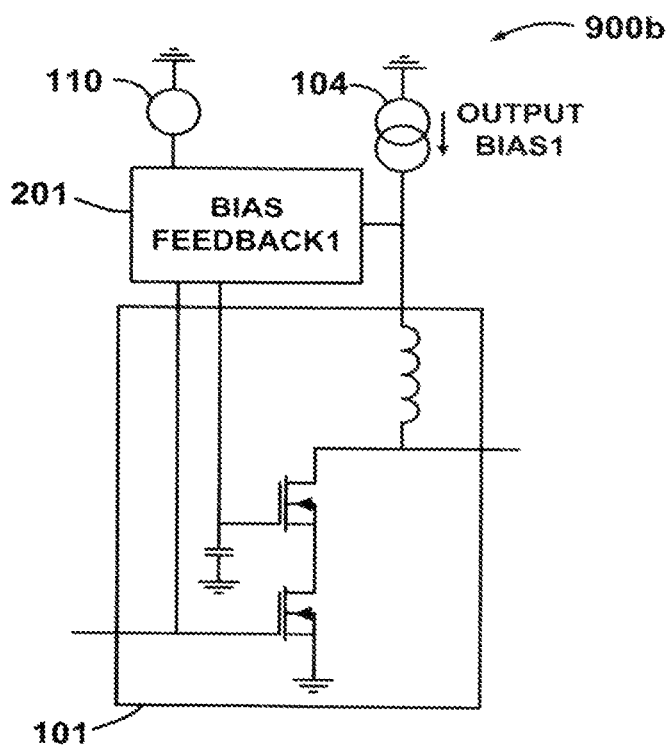
FIG. 12B shows a schematic block diagram of a current-biased transistor-based amplifier branch.

FIG. 12 shows simplified schematics of two exemplary embodiments of the current biased amplifier 101 in FIG. 4 to FIG. 11. In FIG. 12A, a current-biased bipolar-based common-emitter amplifier is shown. FIG. 12B, shows a current-biased cascode configuration using MOSFET transistors.

Figure 13:
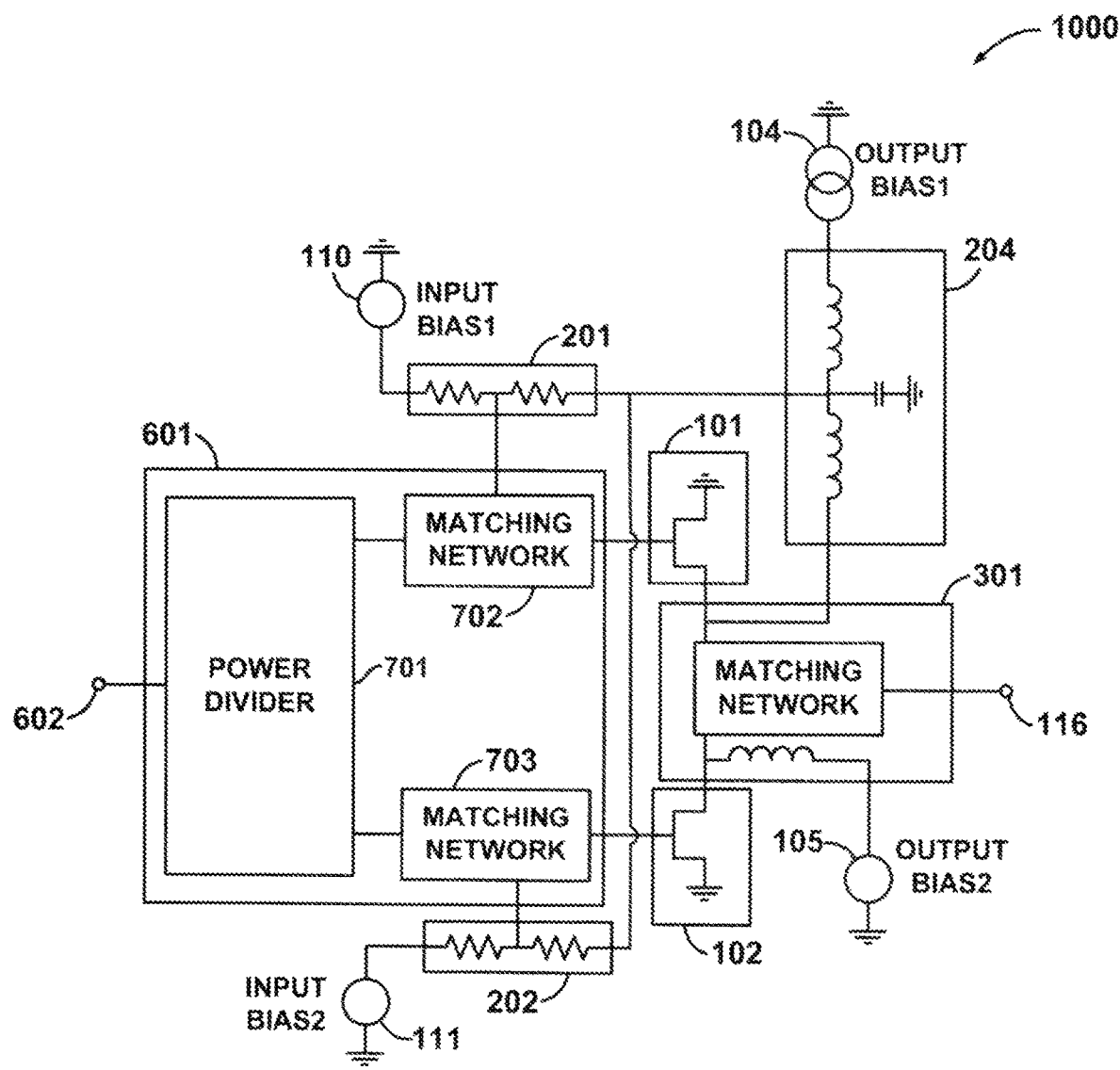
FIG. 13 shows a schematic block diagram of an exemplary embodiment of a dual branch amplifier according to an embodiment of the present matter.

FIG. 13 shows an exemplary embodiment of the multi-branch wideband high efficiency power amplifier 1000. In this exemplary embodiment, FET transistors are used as the amplifier units 101 and 102. The output of the main amplifier 101 is biased using the constant current source 104 through the output bias network 204. The input of the main amplifier 101 is biased using input bias1 110 through the bias feedback 201. In this exemplary embodiment, the output of the second amplifier 102 is biased using the output bias2 source 105 through the output network 301 and its input is biased using input bias2 111 through the bias feedback 202. The input signal from input node 602 is divided using the power divider 701. The matching networks 702 and 703 provide proper impedance matching and delay adjustment at the inputs of the two amplifiers 101 and 102. The output network 301 provides proper load impedance to the amplifiers 101 and 102 and also combine the output powers from the two amplifiers 101 and 102 and delivers the output power to the output terminal 116.

Figure 14:
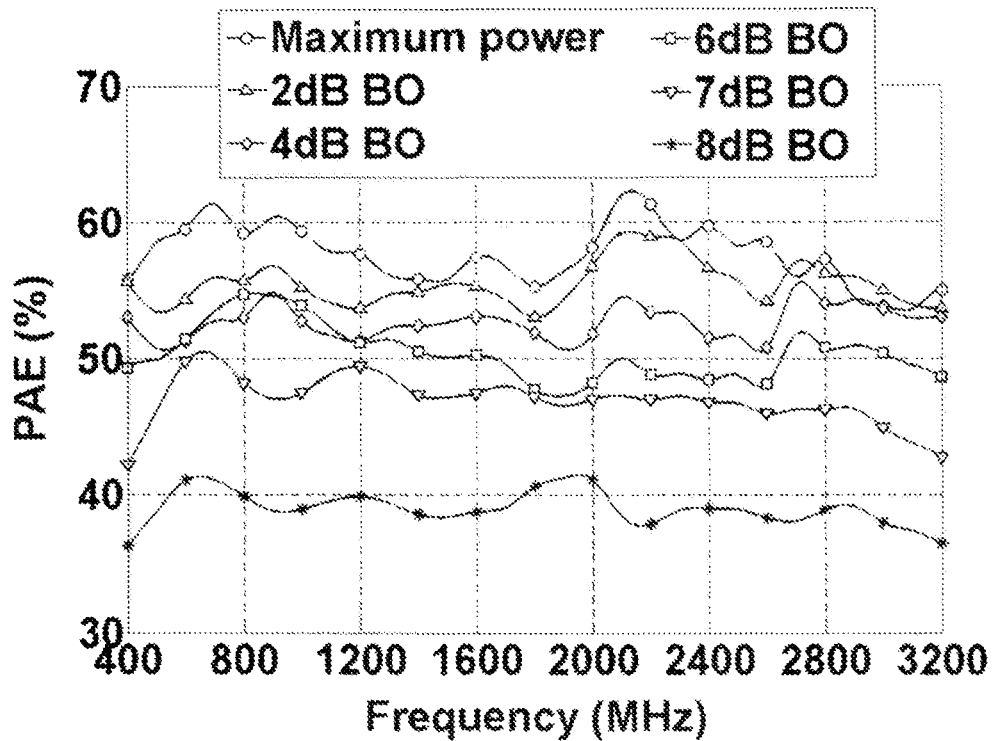
FIG. 14 shows a graph of power added efficiency versus operating frequency for a two-branch amplifier according to an embodiment of the present matter.
Figure 15:
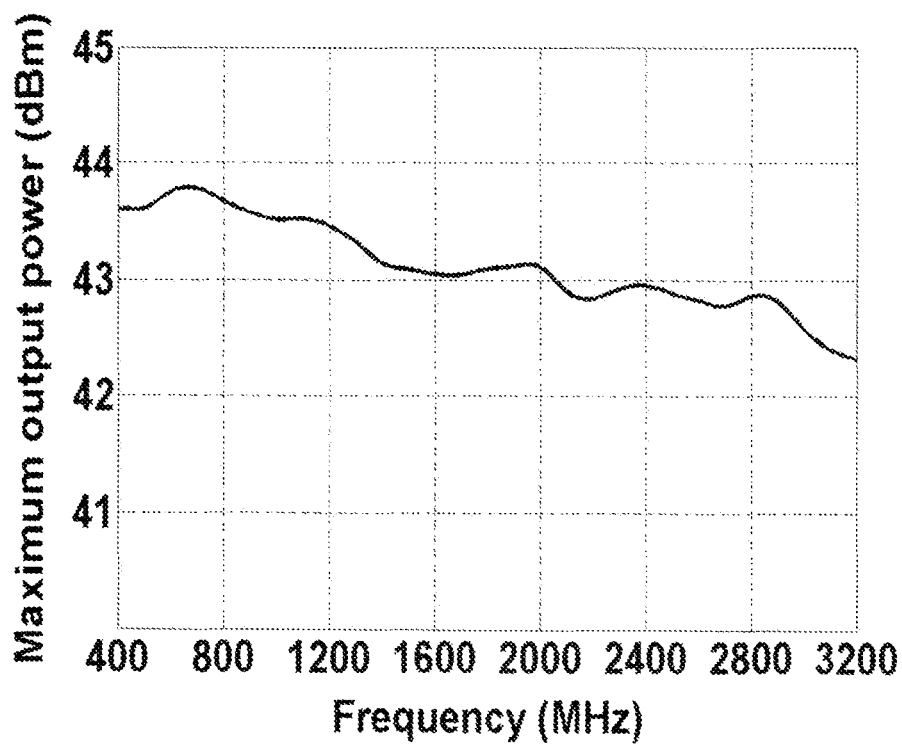
FIG. 15 shows a graph of output power versus operating frequency for a two-branch amplifier according to an embodiment of the present matter.

The typical performance of an exemplary embodiment of the current invention with one current-biased main amplifier and one voltage-biased auxiliary amplifier are shown in FIG. 14 and FIG. 15. FIG. 14 shows that this amplifier exhibits power-added efficiency (PAE) values higher than 40% at 7 dB output power back-off over the 400-3200 MHz frequency range. FIG. 15 shows the output power obtained from the same amplifier over the same 400-3200 MHz frequency range.

Accordingly, it can be understood from the above description that the present invention provides the opportunity to achieve high efficiency at large output power range while simultaneously achieving very large operational frequency bandwidth.

It may be seen that the topologies of the present matter differ from prior art such as the Doherty, outphasing and other amplifier topologies.

Figure 16A:
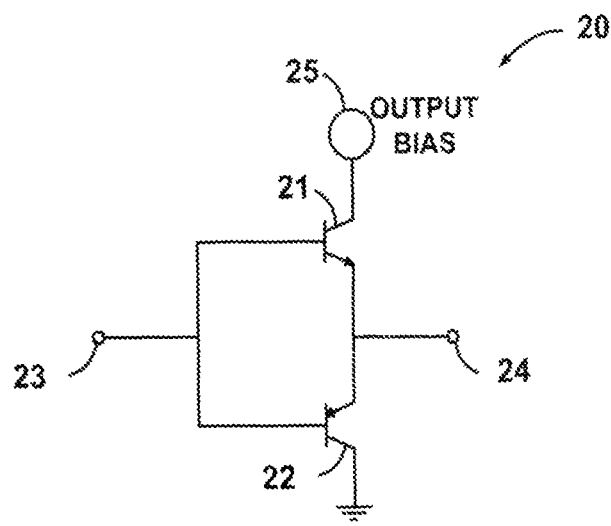
FIGS. 16A and 16B show schematic diagrams of typical push-pull amplifiers having transistors of different types and similar types respectively.

FIG. 16A shows the schematic of a typical push-pull amplifier 20. The push-pull amplifier 20 uses bipolar transistor technology. In the push-pull amplifier 20, one NPN bipolar transistor 21 and one PNP bipolar transistor 22 is used. The input signal is applied to the input terminal 23 and the output signal is delivered to the output terminal 24. The constant-voltage output bias source 25 is used to bias the transistors 21 and 22. In this configuration different types of transistors (NPN and PNP) are used. In some applications, different types of transistors cannot be used.

Figure 16B:
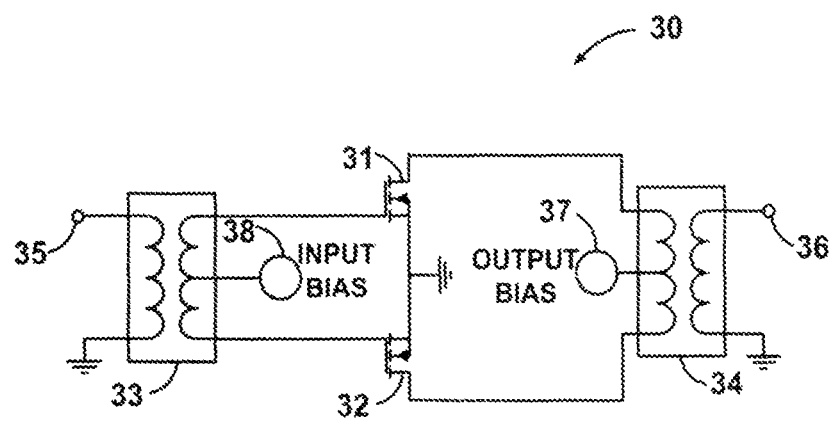

FIG. 16B shows the schematic of a push-pull amplifier 30 for MOSFET transistor technology using an input transformer 33 and an output transformer 34. In the push-pull amplifier 30, two N-channel MOSFET transistors 31 and 32 are used. Because of using the same type for both transistors, one input transformer 33 and one output transformer 34 are needed in the amplifier structure. The constant-voltage output bias 37 is used to bias the transistors 31 and 32 through the output transformer 34. The input bias source 38 is used to bias the input terminals of the transistors 31 and 32 through the input transformer 33. The input signal is applied to the input terminal 35 and the output signal is delivered to the output node 36. Due to limited operating frequency range of the transformers, using the input transformer 33 and the output transformer 34 limits the operation bandwidth of the push-pull amplifier 30.

Figure 17:
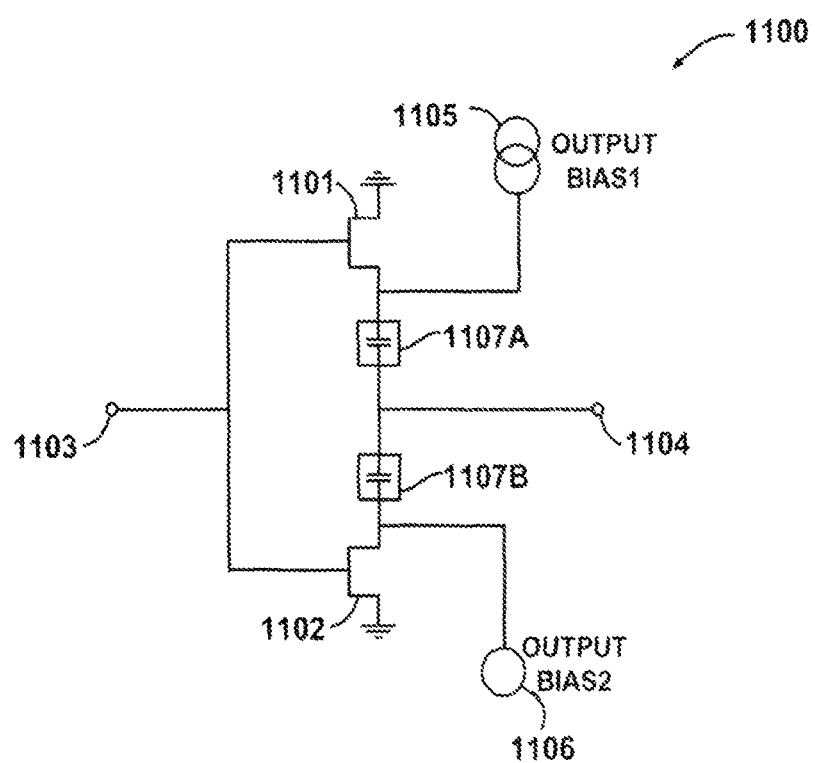
FIG. 17 shows a schematic block diagram of a push-pull amplifier according to an exemplary embodiment of the present matter.

Referring to FIG. 17 there is shown a schematic block diagram of a push-pull amplifier 1100 according to an embodiment of the present matter. The push-pull amplifier 1100 includes two transistors of the same type 1101 and 1102. In case of bipolar transistors, transistors 1101 and 1102 both can be of NPN type. In case of bipolar transistors, transistors 1101 and 1102 both can be of PNP type. In case of FET transistors, transistors 1101 and 1102 both can be of N-channel type. In case of FET transistors, transistors 1101 and 1102 both can be of P-channel type.

The transistor 1101 is biased through its output terminal by a constant-current output bias1 source 1105. The second transistor 1102 is biased through its output terminal by a constant-voltage output bias2 source 1106. The output voltages of the two transistors can be different. DC-blocking elements 1107A and 1107B are used to separate the low frequency components of the transistor output voltages. The DC blocking components 1107A and 1107B present very low impedance at the operating frequency range of the amplifier. The input signal is applied to the input terminal 1103 and the output signal is delivered to the output terminal 1104.

Figure 18A:
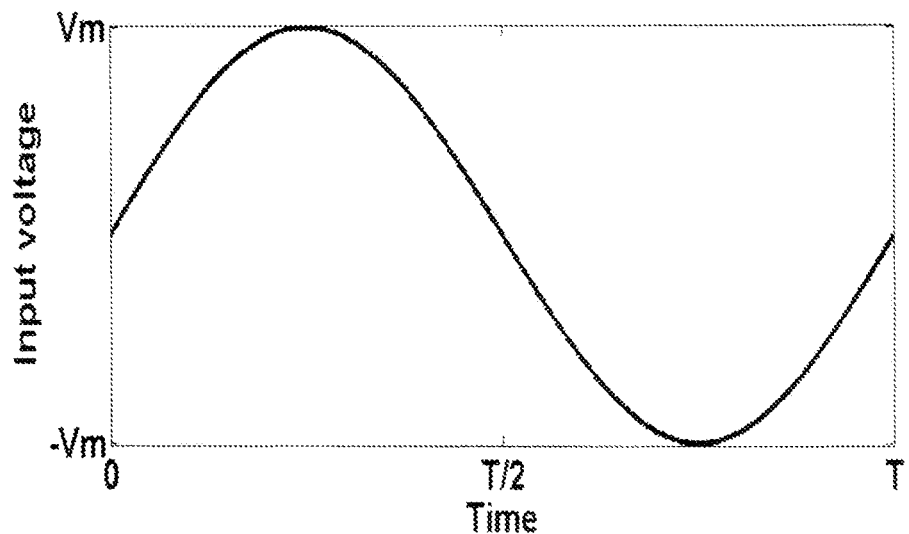
FIG. 18A shows an input voltage waveform of the push-pull amplifier of FIG. 17.
Figure 18B:
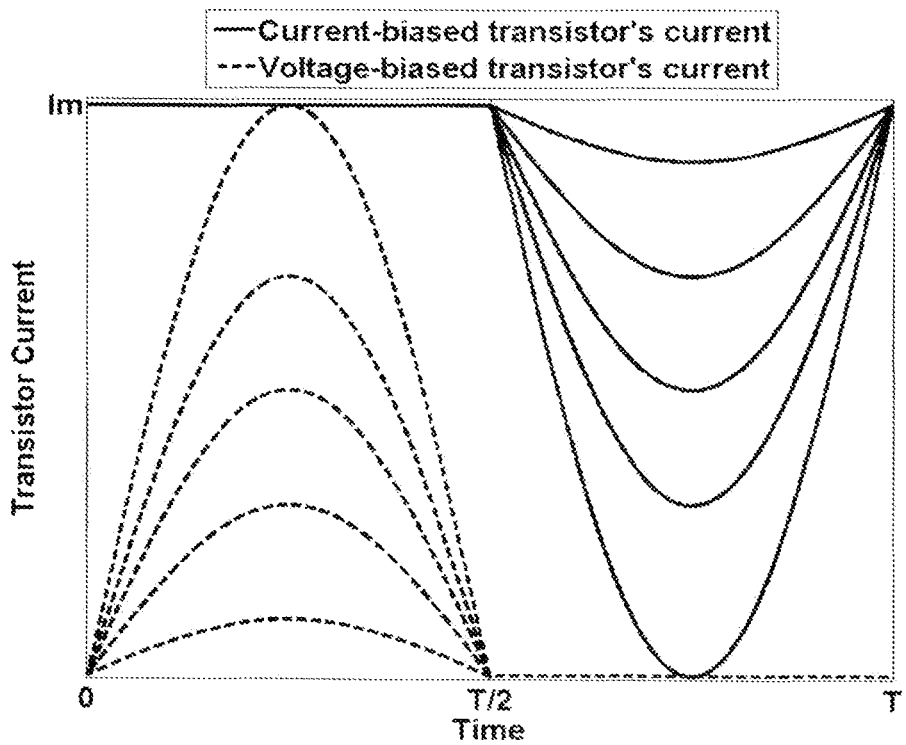
FIG. 18B shows a current waveform of the respective current biased and voltage biased transistors in the push-pull amplifier of FIG. 17.
Figure 18C:
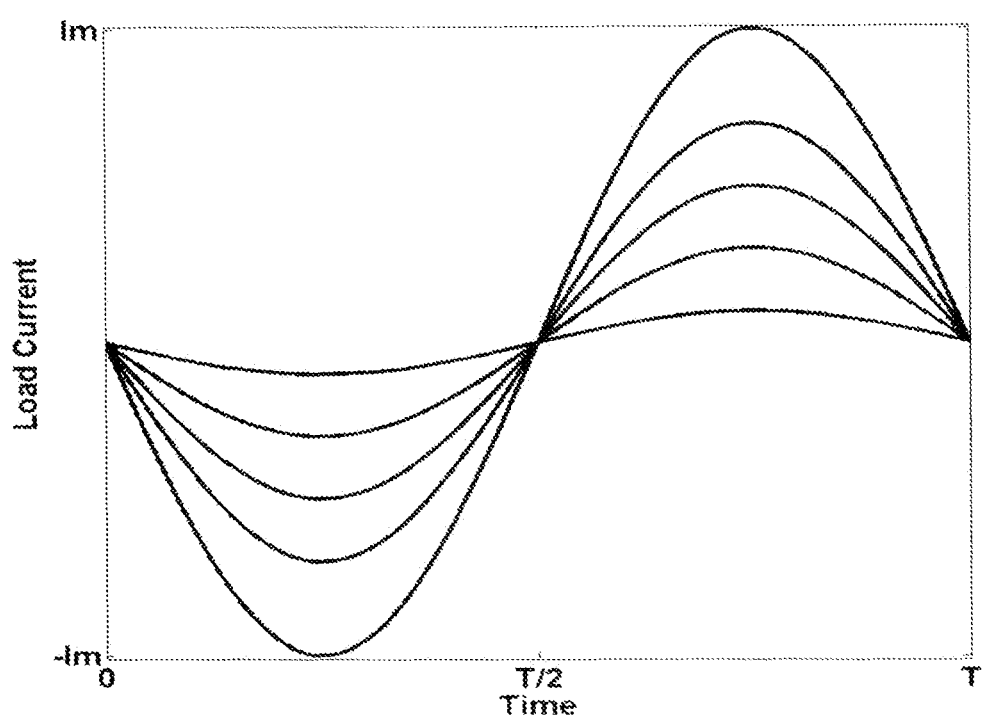
FIG. 18C shows an output current waveform for the push-pull amplifier of FIG. 17.

FIGS. 18A and 18B show the input voltage and transistor current waveforms, respectively of the transistors 1101 and 1102. FIG. 18A shows the input signal applied to the input terminal 1103 of the push-pull amplifier 1000. In the first half-cycle (time between 0 and T/2), the voltage biased transistor 1102 turns on and current flows into the voltage biased transistor. It causes the current to be drawn from the output terminal 1104. The dashed lines in FIG. 18B are the current going through the voltage-biased transistor 1102 for different amplitudes of the input voltage signal. In the second half-cycle (time between T/2 and T), the voltage biased transistor 1102 turns off and the current flowing into the voltage-biased transistor is zero. Referring to FIG. 3, in the first half-cycle (time between 0 and T/2), the current biased transistor 1101 remains in saturation and draws a constant current from the load. In the second half-cycle (time between T/2 and T), the current flowing through the current-biased transistor 1101 decreases according to the input voltage signal resulting in current injection into the output terminal 1104. The solid lines in FIG. 18B are the current going through the current-biased transistor 1101 for different amplitudes of the input voltage signal. The resulting current waveform in the output terminal is shown in FIG. 18C for different input signal amplitudes.

As can be seen from the waveforms, by using a current-biased transistor and a voltage-biased transistor, pure sinusoidal output signal can be obtained by using two transistors of the same type and without using transformers at the input and output of the amplifier.

Figure 19:
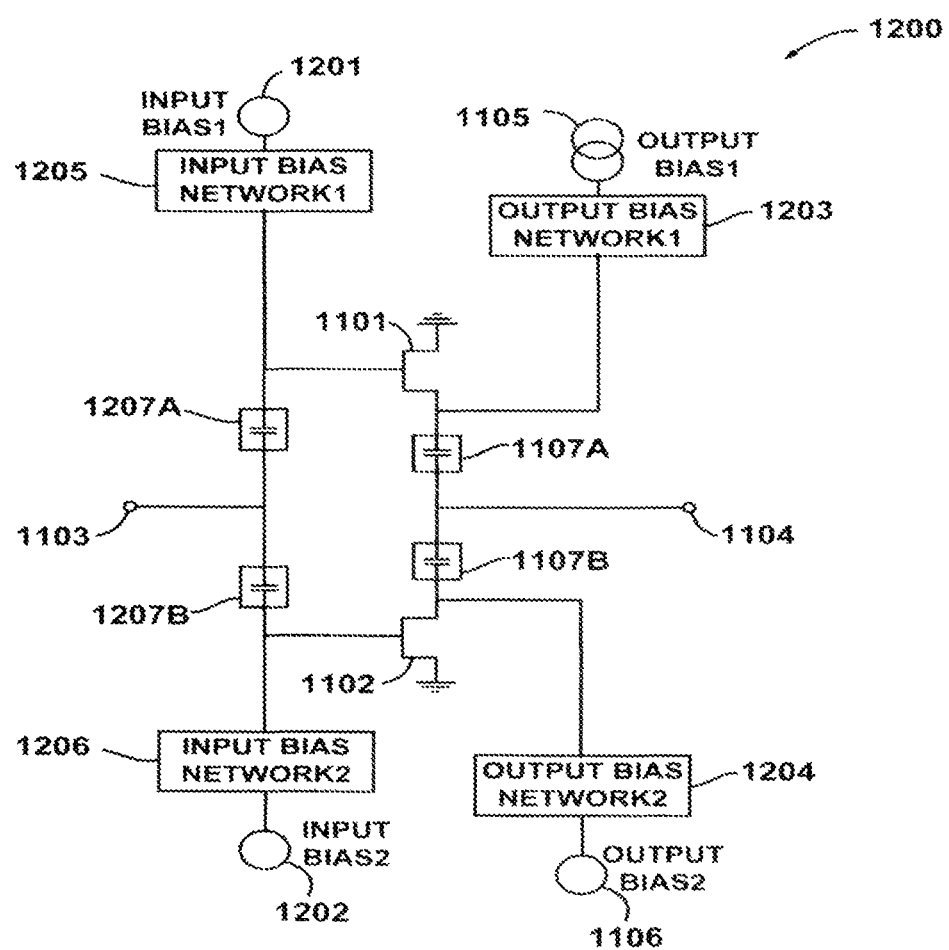
FIG. 19 shows a schematic block diagram of another embodiment of a push-pull amplifier according to the present matter.

FIG. 19 shows an exemplary embodiment of the current invention where a push-pull amplifier 1200 is implemented with one transistor 1101 biased through its output terminal by an output bias1 source 1105, one transistor 1102 biased through its output terminal by an output bias2 source 1106, two input bias sources 1201 and 1202, two output bias networks 1203 and 1204, and two input bias networks 1205 and 1206. The input bias sources 1201 and 1202 are used to bias the input terminals of the transistors 1101 and 1102 respectively. Using input bias sources 1201 and 1202 improves linearity of the amplifier by decreasing distortions in the output current waveforms. The two output bias networks 1203 and 1204 are used to decrease signal current leakage into the output bias sources 1105 and 1106 respectively. The two input bias networks 1205 and 1206 are used to decrease signal current leakage into the input bias sources 1201 and 1202 respectively. The input voltages of the two transistors can be different. DC-blocking elements 1207A and 1207B are used to separate the low frequency components of the transistor input voltages. The DC blocking components 1207A and 1207B present very low impedance at the operating frequency range of the amplifier.

Figure 20:
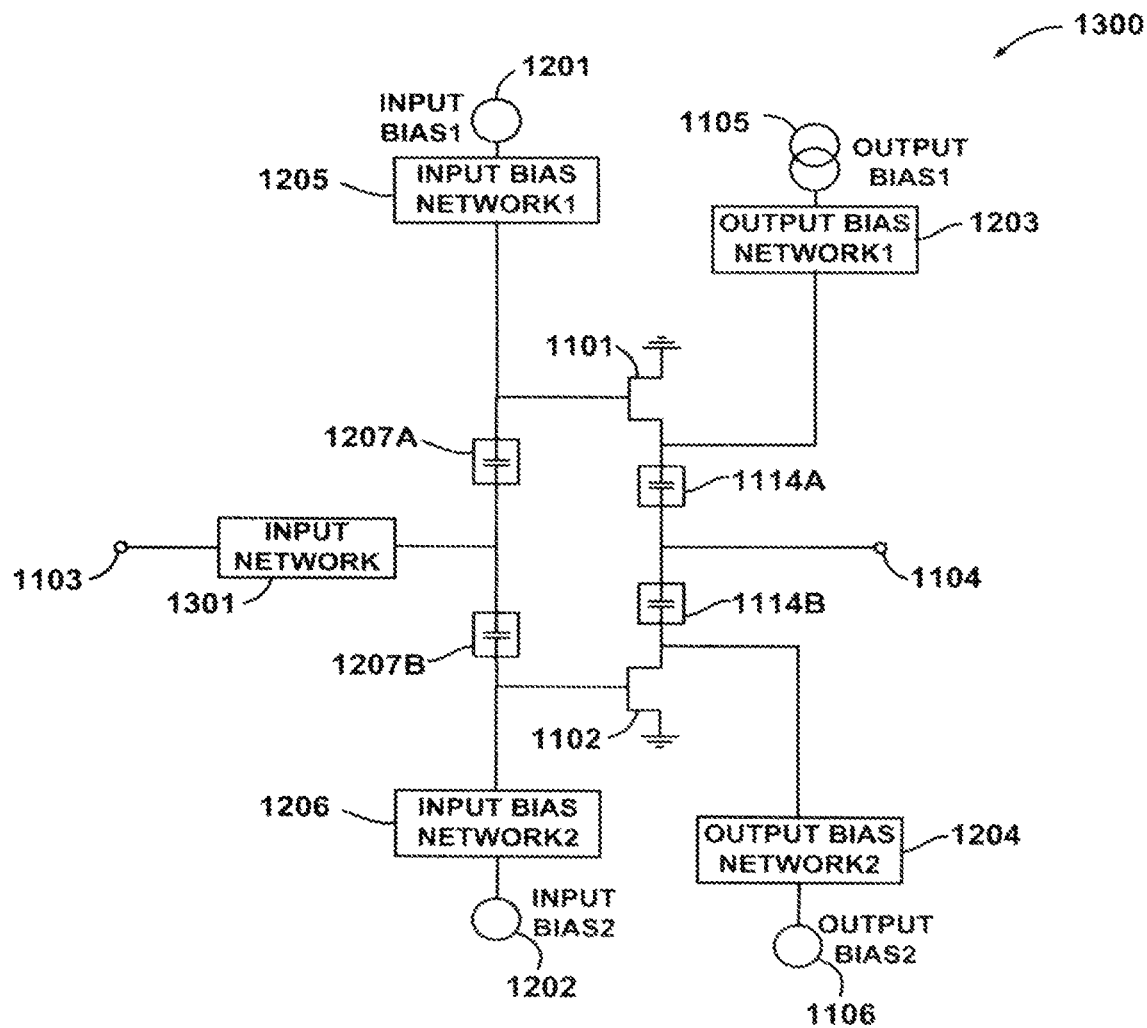
FIG. 20 shows a schematic block diagram of another embodiment of the present matter.

FIG. 20 shows an exemplary embodiment of the current invention where a push-pull amplifier 1300 is implemented with an input network 1301. The input network 1301 converts the source impedance to the optimum impedance required at the transistor inputs if impedance conversion is needed.

Figure 21:
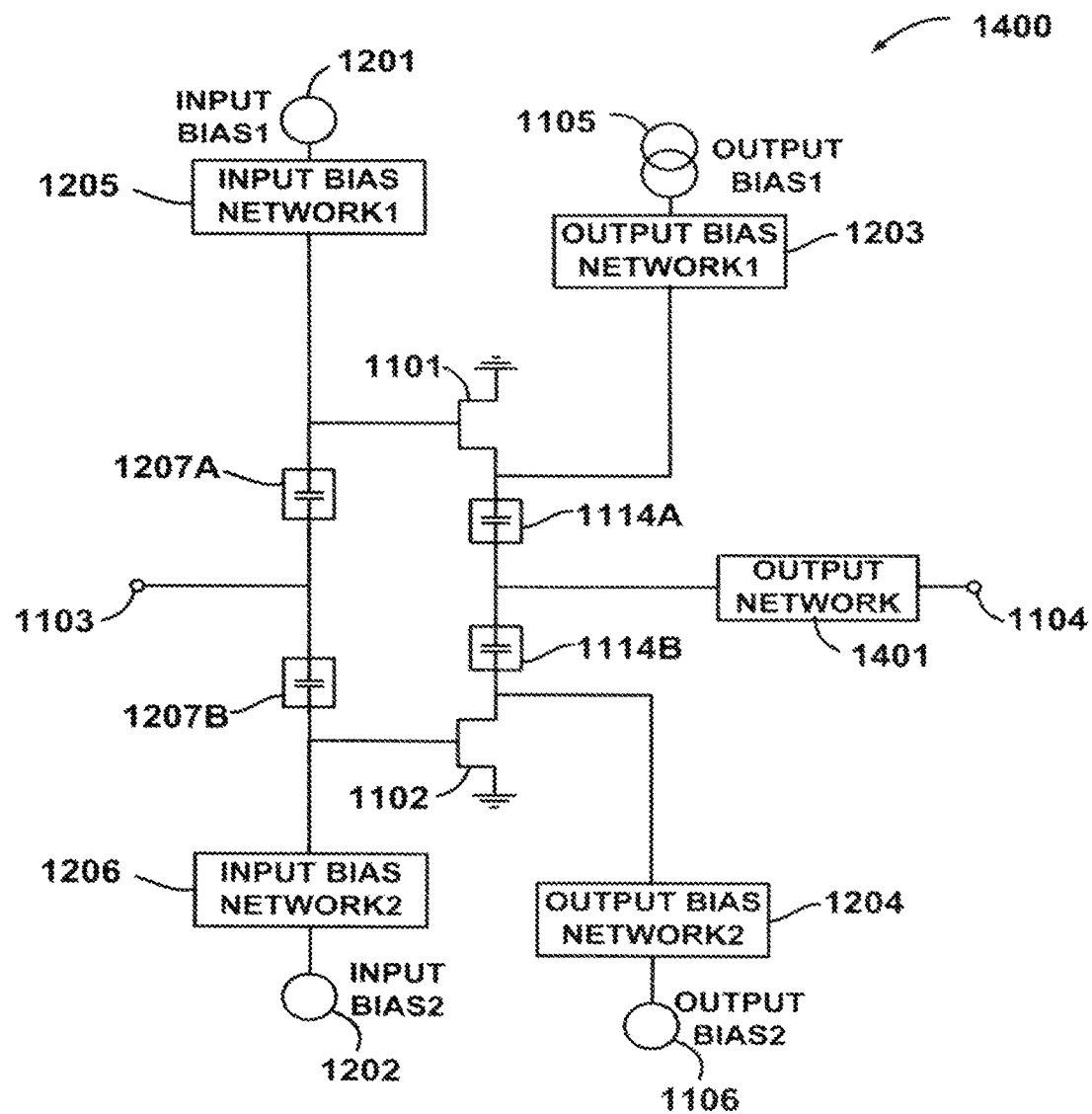
FIG. 21 shows a schematic block diagram of another embodiment of the present matter.

FIG. 21 shows an exemplary embodiment of the current invention where a push-pull amplifier 1400 is implemented with an output network 1401. The output network 1401 converts the load impedance to the optimum impedance required at the transistor outputs if impedance conversion is needed.

Figure 22:
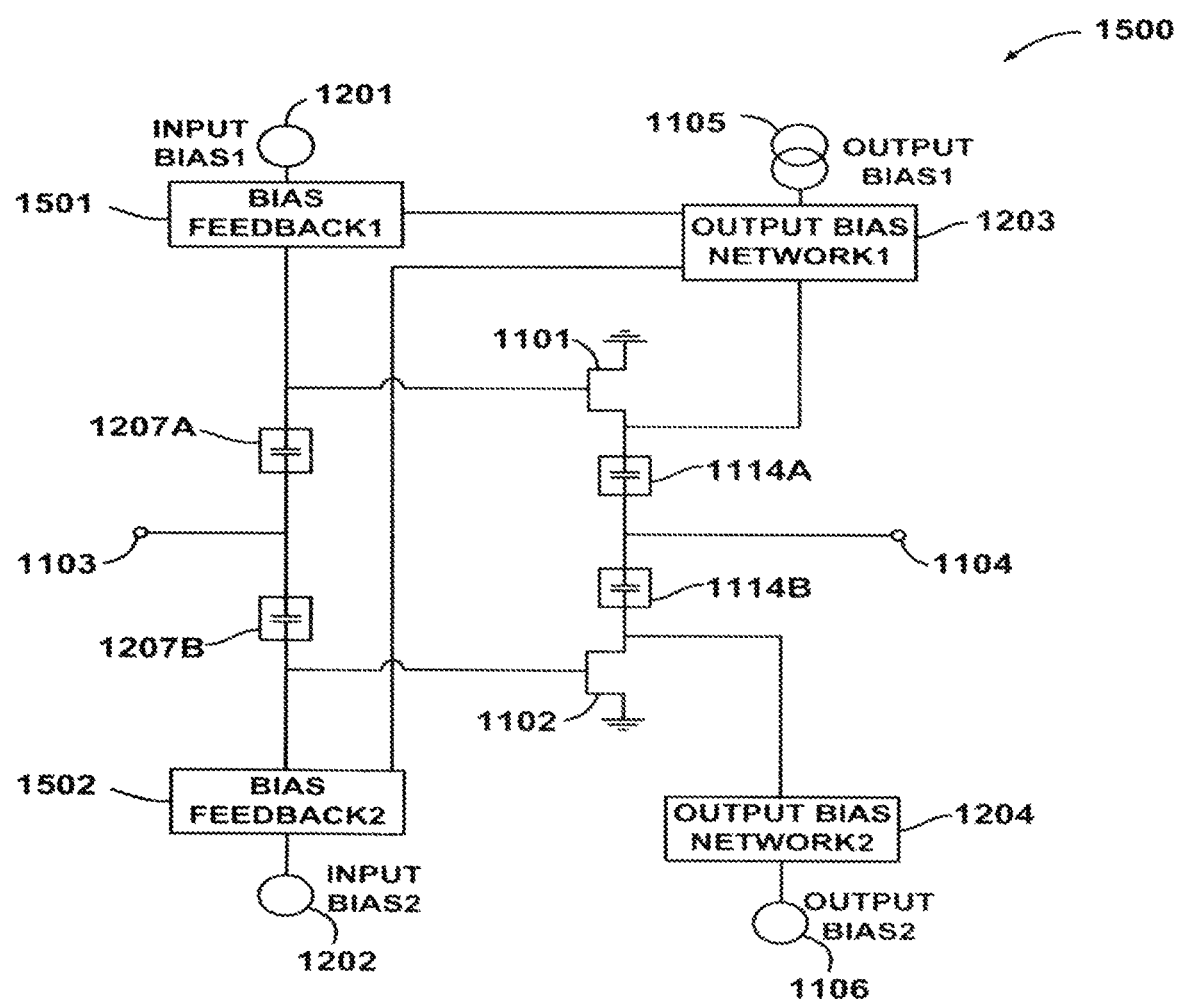
FIG. 22 shows a schematic block diagram of another embodiment of the present matter.

FIG. 22 shows an exemplary embodiment of the current invention where a push-pull amplifier 1500 is implemented with two additional bias feedback networks 1501 and 1502. For amplitude-modulated signals, the bias voltage for current-biased transistor 1101 varies according to the envelope of the input signal. This varying voltage can be used for bias stabilization and input bias adaptation by using bias feedback networks 1501 and 1502. The input bias adaptation can be used for linearization of the push-pull amplifier 1500. Bias feedback1 1501 can also be used to avoid thermal runaway when biasing transistor 1101 using a current source.

Figure 23:
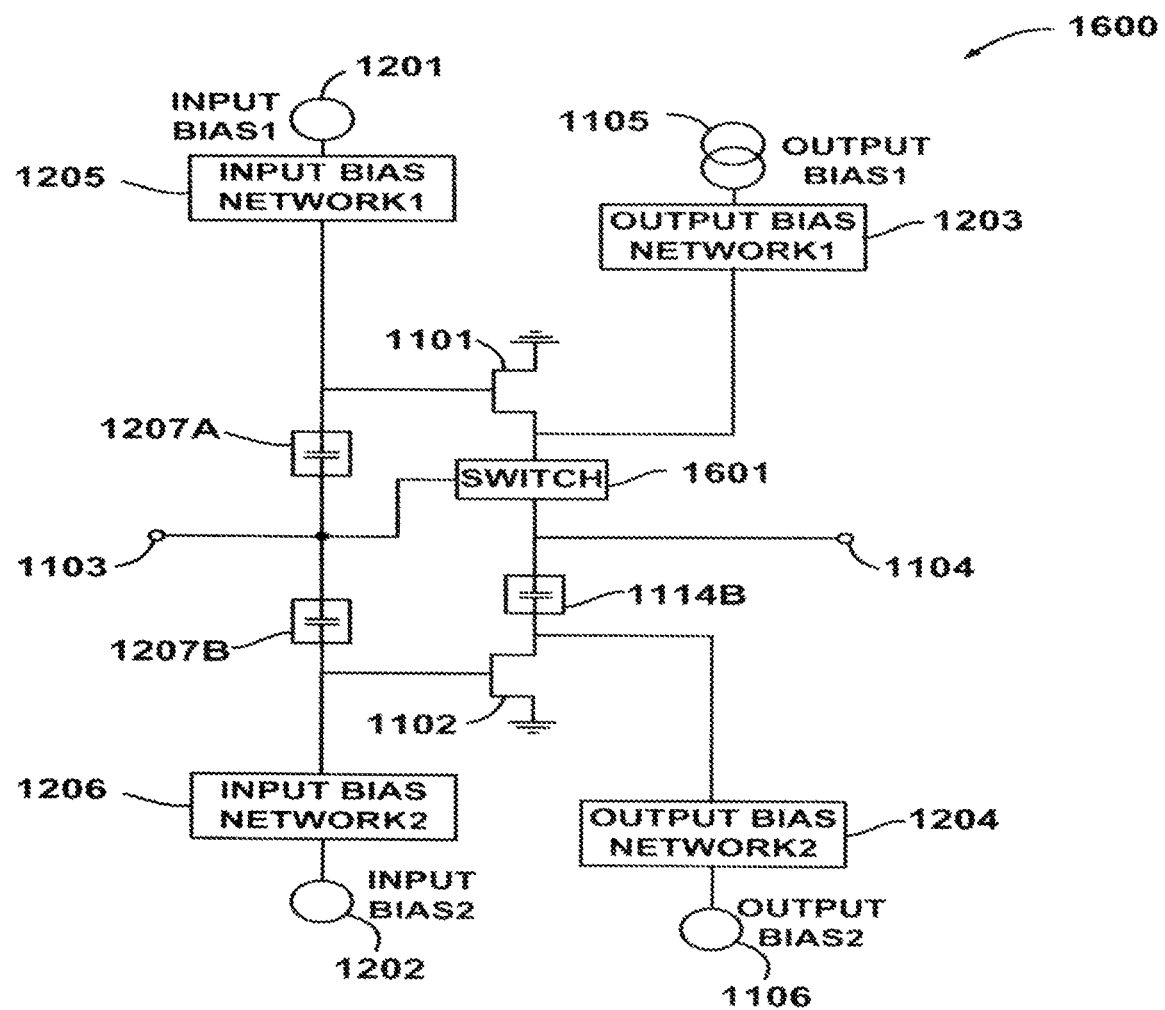
FIG. 23 shows a schematic block diagram of another embodiment of the present matter.

FIG. 23 shows an exemplary embodiment of the current invention where a push-pull amplifier 1600 is implemented with one additional switch circuit 1601. The switch circuit 1601 is used to prevent the output current of the voltage biased transistor 1102 from leaking into the current-biased transistor 1101 during the half cycle that voltage-biased transistor 1102 is active. Referring to FIG. 18, the switch circuit 1601 presents an open circuit at the first half cycle (time between 0 and T/2) where the voltage-biased transistor 1102 is active. The switch circuit 1601 presents short circuit at the second half cycle (time between T/2 and T) where the voltage-biased transistor 1102 is off.

Figure 24:
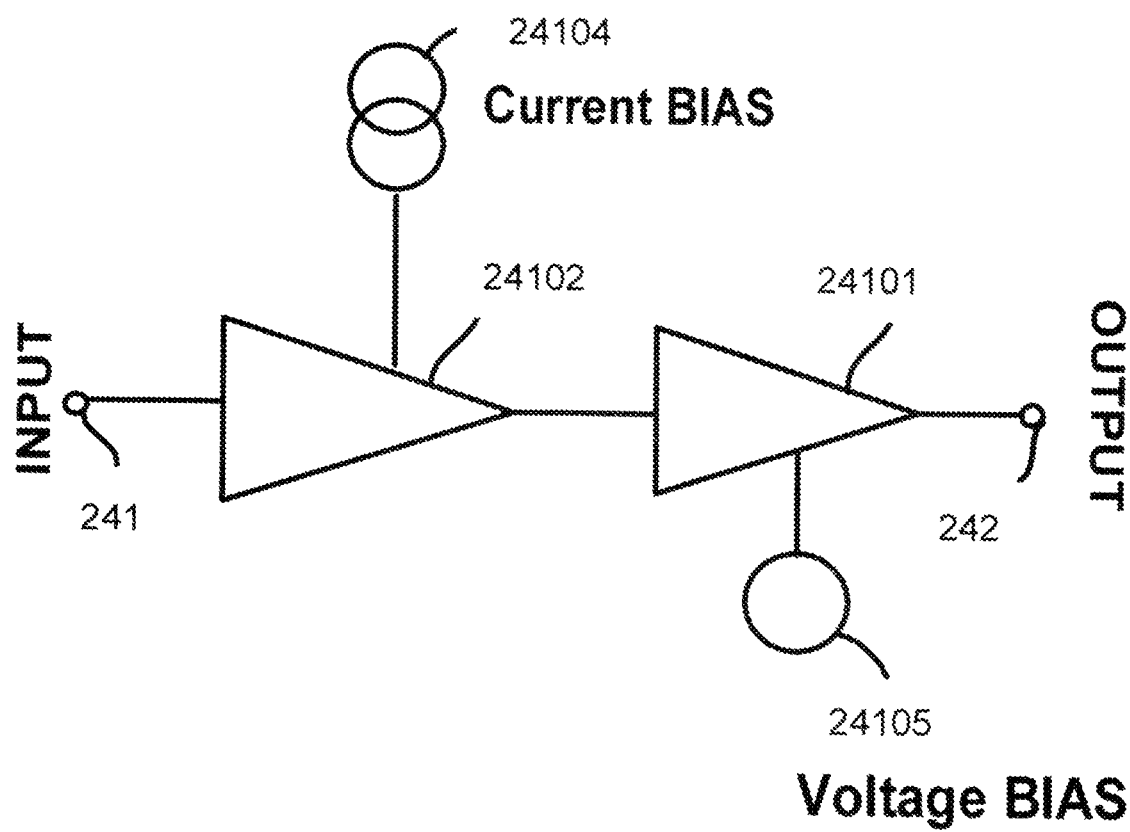
FIG. 24 shows a schematic block diagram of still another embodiment of the present matter.

Referring to FIG. 24 there is shown a block diagram of an amplifier 2400 according to another embodiment of the present matter. The amplifier 2400 includes first and second active devices 24102, 24101 connected in cascade, with the cascade having an input 241 and an output 242. The amplifiers 24102, 24101 have respective bias circuits 24104, 24105. In the illustrated embodiment the first amplifier 24102 has a current bias circuit 24104 and the second amplifier 24101 has a voltage bias circuit 24105. In a still further embodiment, the first amplifier 24102 has a voltage bias circuit 24104 and the second amplifier 24101 has a current bias circuit 24105. The ratio of the output signal at the output terminal 242 and the input signal at the input terminal 241 is substantially constant as a function of the amplitude of the input signal such that the first amplifier in the cascade with the second amplifier acts as a predistorter for the second amplifier. Further, the amplifier 2400 is configured by choosing the appropriate biasing and impedance matching conditions for linearization of this amplifier such that the ratio of the output signal to the input signal is constant as a function of the input signal magnitude. As may be appreciated the cascaded current biased and voltage biased combination may be used in multibranch amplifier circuit configurations described herein wherein the cascaded arrangement may provide linearization (where one of the amplifiers in the cascade acts as a the predistorter for the second amplifier in the cascade) in the branches.

Figure 25:
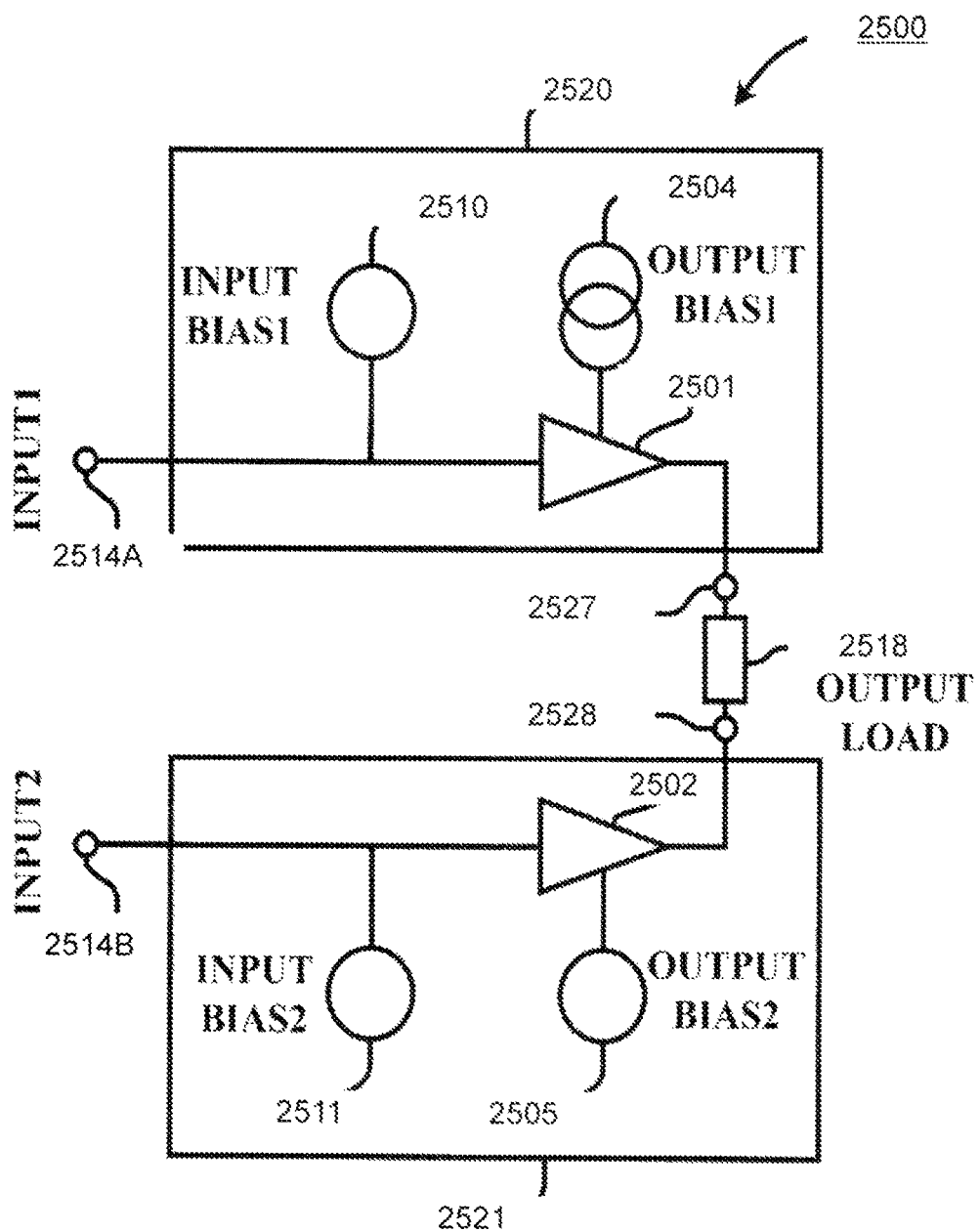
FIG. 25 shows a schematic block diagram of a multi-branch amplifier according to an embodiment of the present matter.
Figure 26A:
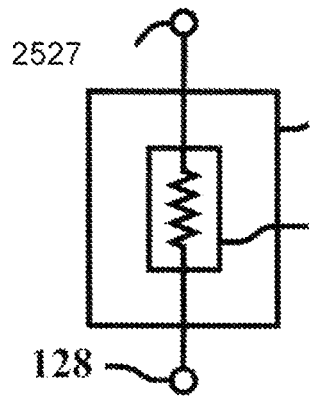
FIGS. 26A to 26D shown respectively different types of output loads according to an embodiment of the present matter.
Figure 26B:
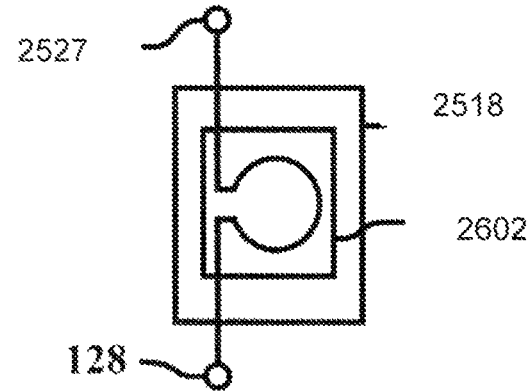
Figure 26C:
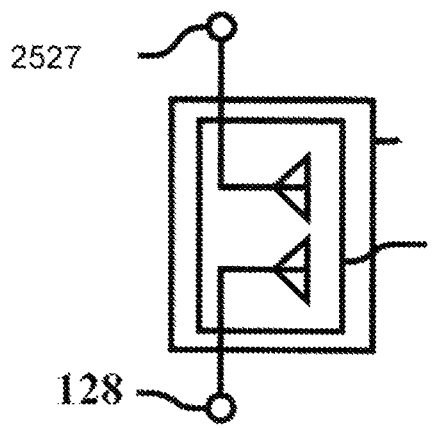
Figure 26D:
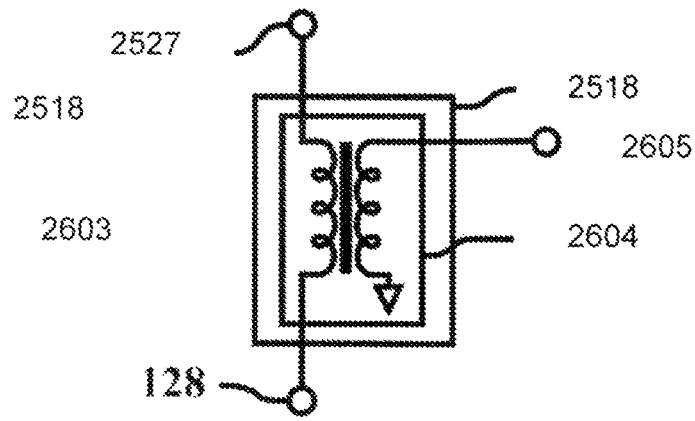

Referring to FIG. 25 there is shown a schematic block diagram of a multi-branch amplifier 2500 according to an embodiment of the present matter. The multi-branch amplifier 2500 includes for example two branches, a main branch 2520 and an auxiliary branch 2521. The main branch 2520 includes a transistor-based main amplifier 2501 having an input terminal 2514A and output terminal 2527, and a constant current source bias OUTPUT BIAS1 2504 connected to the output terminal 2527 of the main amplifier 2501. The auxiliary branch 2521 includes a transistor-based auxiliary amplifier 2502 also having an input terminal 2514B and output terminal 2528. The auxiliary amplifier 2502 is biased through its output terminal by an output bias source OUTPUT BIAS2 2505. The output bias source 2505 may be either a voltage source, or a current source. Each branch also includes respective input bias sources, INPUT BIAS1 2510 and INPUT BIAS2 2511 for biasing the respective input terminals of the transistor-based amplifiers 2501, 2502. The output signals of the respective amplifiers 2501 and 2502 are combined in series through an output load 2518.

Referring to FIGS. 26A to 26D there is shown respectively different types of output loads 2518 that to may be applied to the output of the multibranch amplifier 2500. The load 2518 may include for example one or more of a resistive type load device 2601, a multi-port antenna 2602, an antenna array 2603, or a balun device 2604 with an output port 2605.

Figure 27:
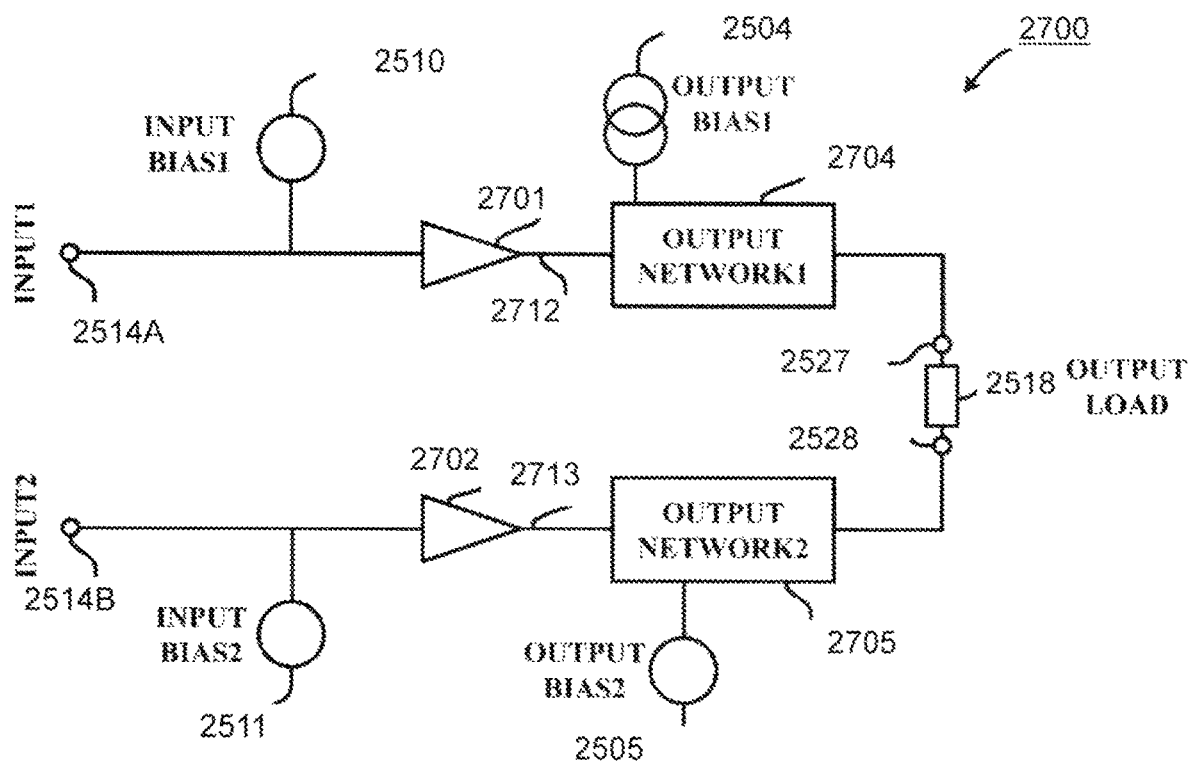
FIG. 27 shows a schematic block diagram of a two-branch amplifier of still another embodiment of the present matter.

Referring to FIG. 27 there is shown a schematic block diagram of a two-branch amplifier 2700 according to another embodiment of the present matter. Similar to the multibranch amplifier 2500, the amplifier 2700 includes first and second transistor-based amplifiers 2701 and 2702 in respective branches and similar input bias and output bias sources. The amplifier 2700 further includes, in each branch an output network 2704 and 2705 respectively, and wherein the output networks are configured to present appropriate load impedances to the output terminals 2712 and 2713 of the transistor-based amplifiers 2701 and 2702, respectively.

Figure 28:
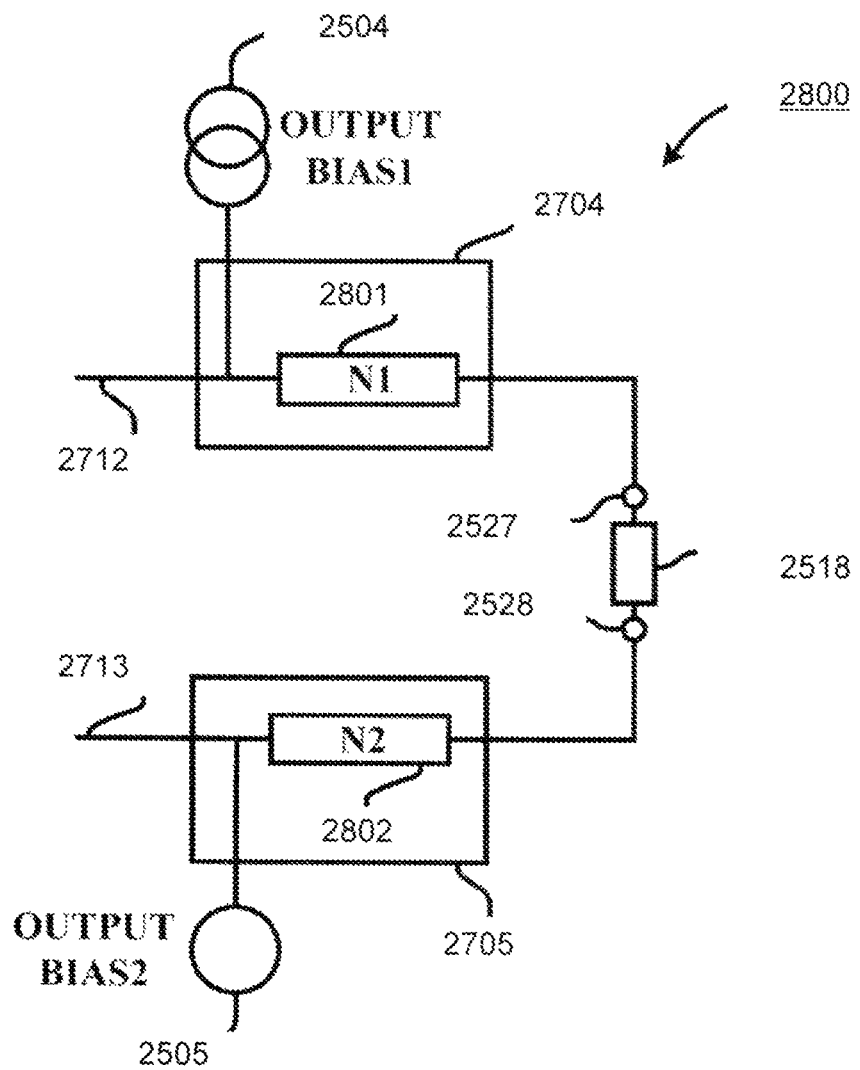
FIG. 28, shows a schematic block diagram of output networks according to another embodiment of the present matter.

Referring to FIG. 28, there is shown a schematic block diagram of one implementation 2800 of the output networks 2704 and 2705 according to an embodiment of the present matter. In this implementation, each output network comprises network elements denoted by N1 and N2, 2801 and 2802, respectively. The network elements provide the bias to the respective output nodes 2712 and 2713 of the transistor-based amplifiers respectively (shown in FIG. 27). The networks N1 and N2 are additionally configured for converting the load impedance to the optimum impedances at the two transistor-based amplifier output nodes 2712 and 2713.

Figure 29:
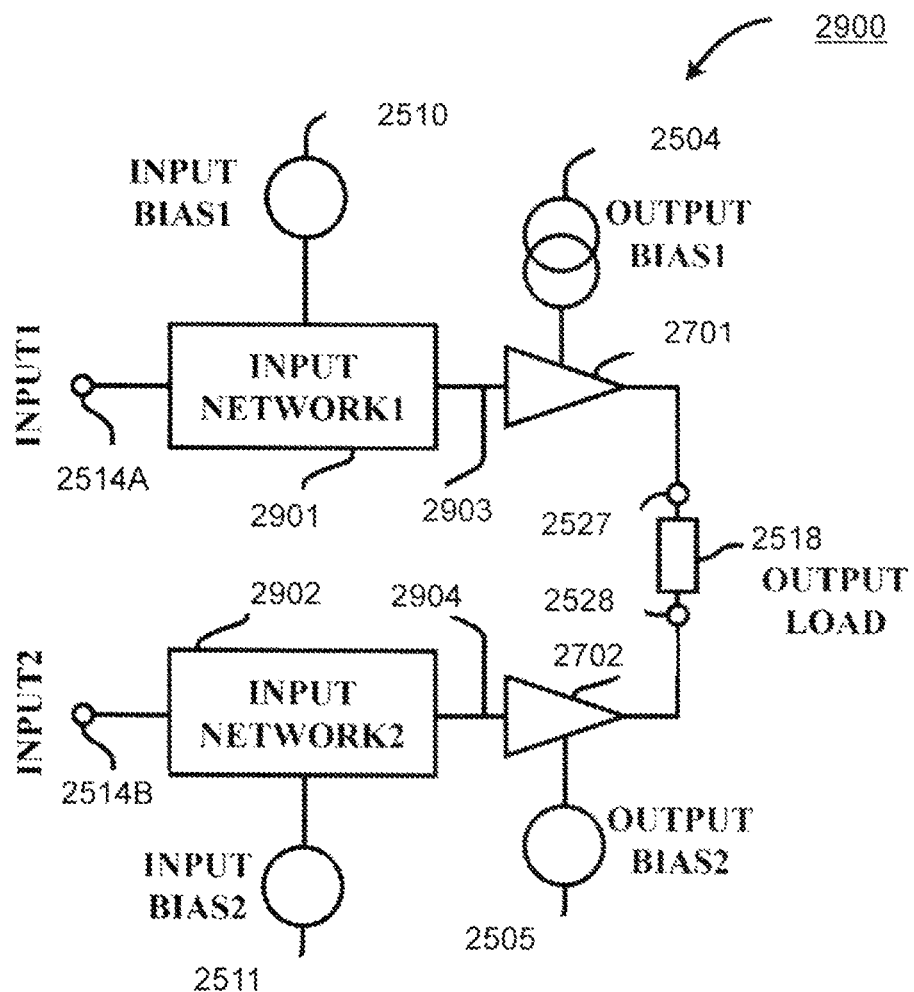
FIG. 29 shows a schematic block diagram of a two-branch amplifier according to a still further embodiment of the present matter.

Referring to FIG. 29 there is shown a schematic block diagram of a two-branch amplifier 2900 according to a further embodiment of the present matter. The amplifier 2900 is similar to similar to the multibranch amplifier 2500 however includes input networks which, in the illustrated embodiment, comprises first and second input networks 2901, 2902 coupled respectively to inputs 2903, 2904 corresponding to amplifiers 2701 and 2702. The first input network 2901 and second input network 2902 are configured to convert source impedances to optimum impedances at the respective input nodes 2903, 2904 corresponding to the respective transistor-based amplifiers 2701, 2702. In other instances, for example the amplifier 2900, may have branches with the input network while the other branches may not have the input network.

Figure 30:
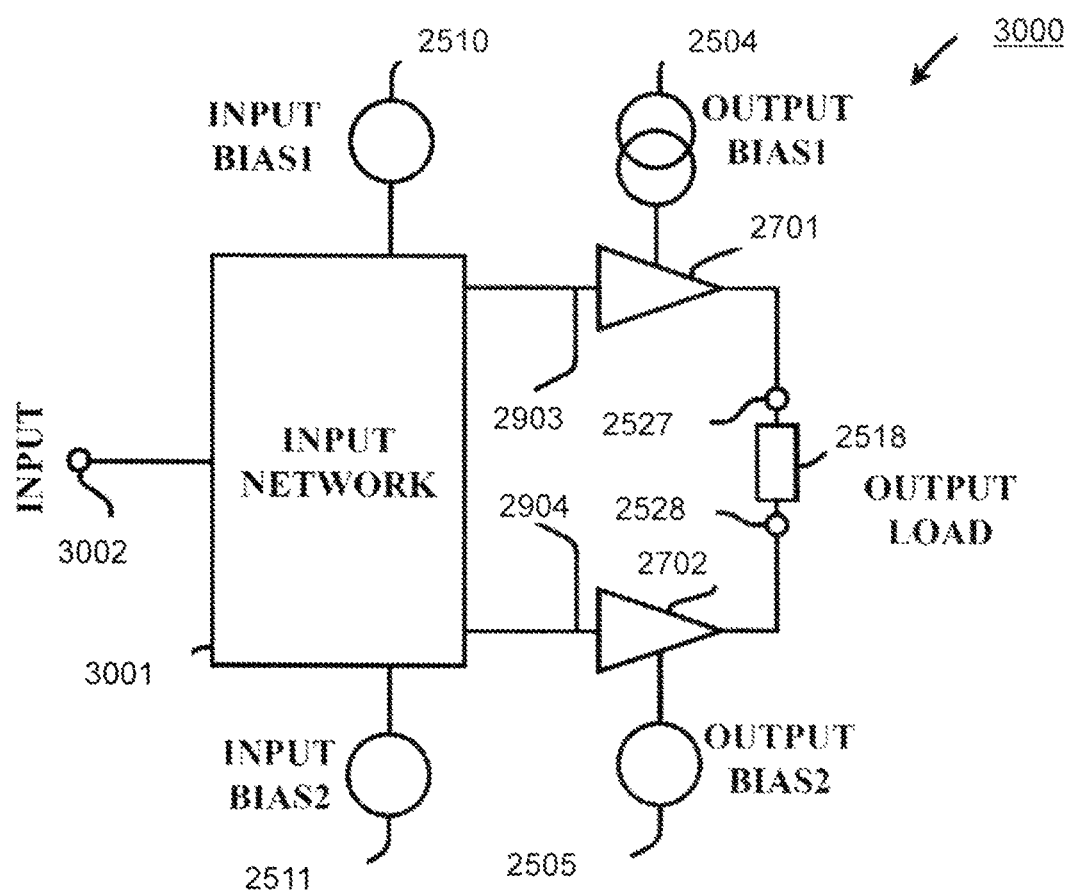
FIG. 30 shows a schematic block diagram of a two-branch amplifier according to a still further embodiment of the present matter.

Referring to FIG. 30 there is shown a schematic block diagram of a two-branch amplifier 3000 according to a still further embodiment of the present matter. The amplifier 3000 includes, in the illustrated embodiment, a multi-port input network 3001. The multi-port input network 3001 includes an input port 3002 which splits an applied input signal to between the respective amplifier branches. The multi-port input network may also be configured to convert the source impedance to the optimum impedances at the two transistor-based amplifier input nodes 2903 and 2904 respectively. The input network 3001 may be implemented in various forms. For example multi-port input network may include a power divider network (not shown) which splits the signal applied to input port 3102, the split signals are applied to respective matching networks (not shown) which in turn then provide the optimum source impedance to the transistor-based amplifier input terminals 2903, 2904 in the respective branches.

Figure 31:
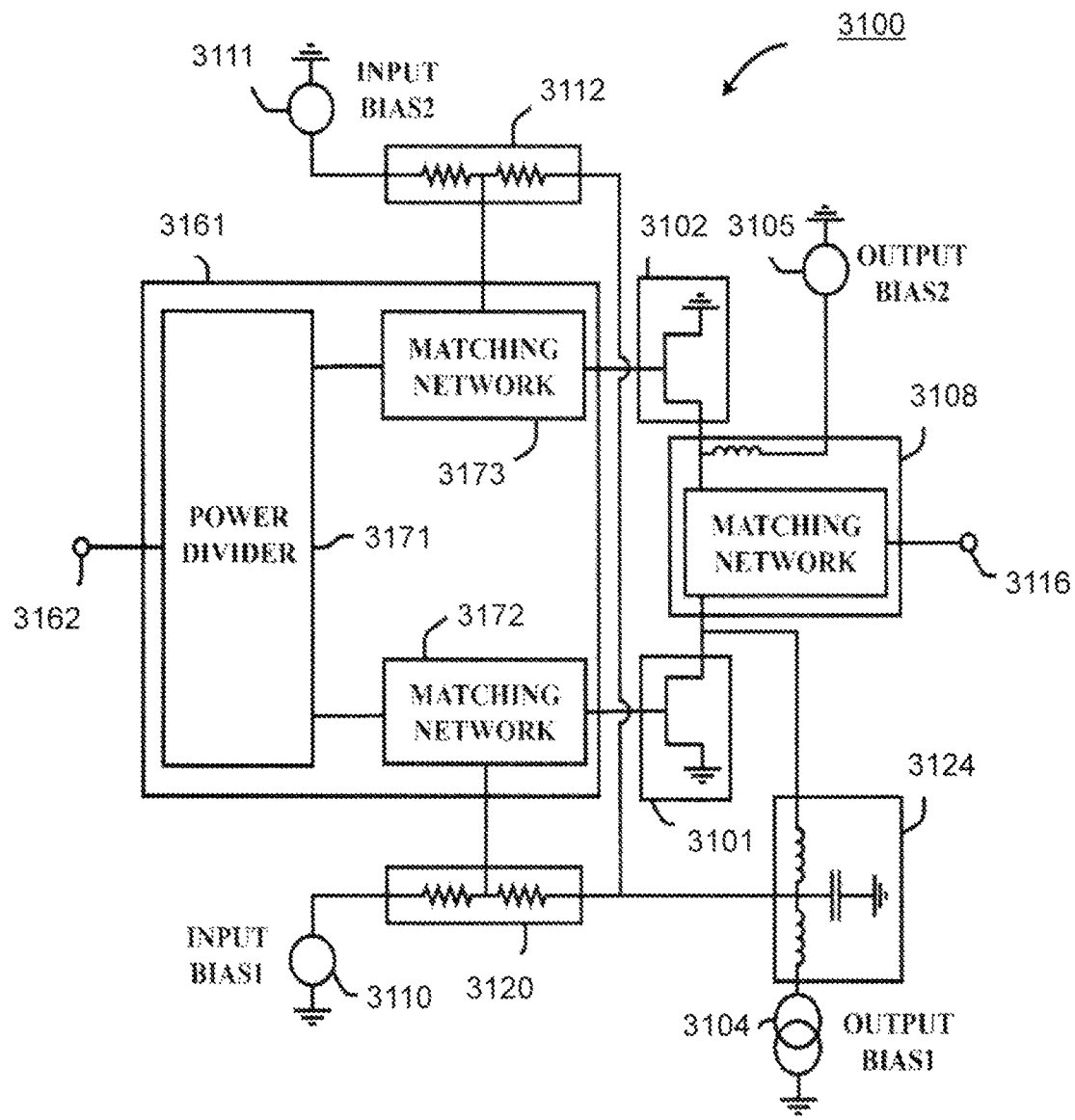
FIG. 31 shows a schematic block diagram of a multi-branch amplifier according to a further embodiment of the present matter.

Referring to FIG. 31 there is shown a schematic block diagram of a multi-branch amplifier 3100 according to a further embodiment of the present matter. The multi-branch amplifier 3100 is implemented with FET transistors 3102, 3101 in the first and second transistor-based amplifiers in respective main and auxiliary branches. The output of the main amplifier 3102 is biased using the output bias2 source 3105 through the output network 3108. The input of the main amplifier 3102 is biased using input bias2 3111 through a bias feedback 3112. In this exemplary embodiment, the output of the second amplifier 3101 is biased using the constant current source 3104 through the output bias network 3124 and the input is biased using input bias1 3110 through the bias feedback 3120. The amplifier further includes a power divider/matching network 3161 having an input node 3162. An input signal applied to the input node 3162 is divided, using the power divider 3171, between matching networks 3173 and 3172 which in turn provide impedance matching and delay adjustment at the inputs of the respective amplifiers 3102 and 3101. The output network 3108 provides load impedance to the amplifiers 3101 and 3102 and also combine the output powers from the two amplifiers 3101 and 3102 to deliver the output power to the output terminal 3116.

Figure 32:
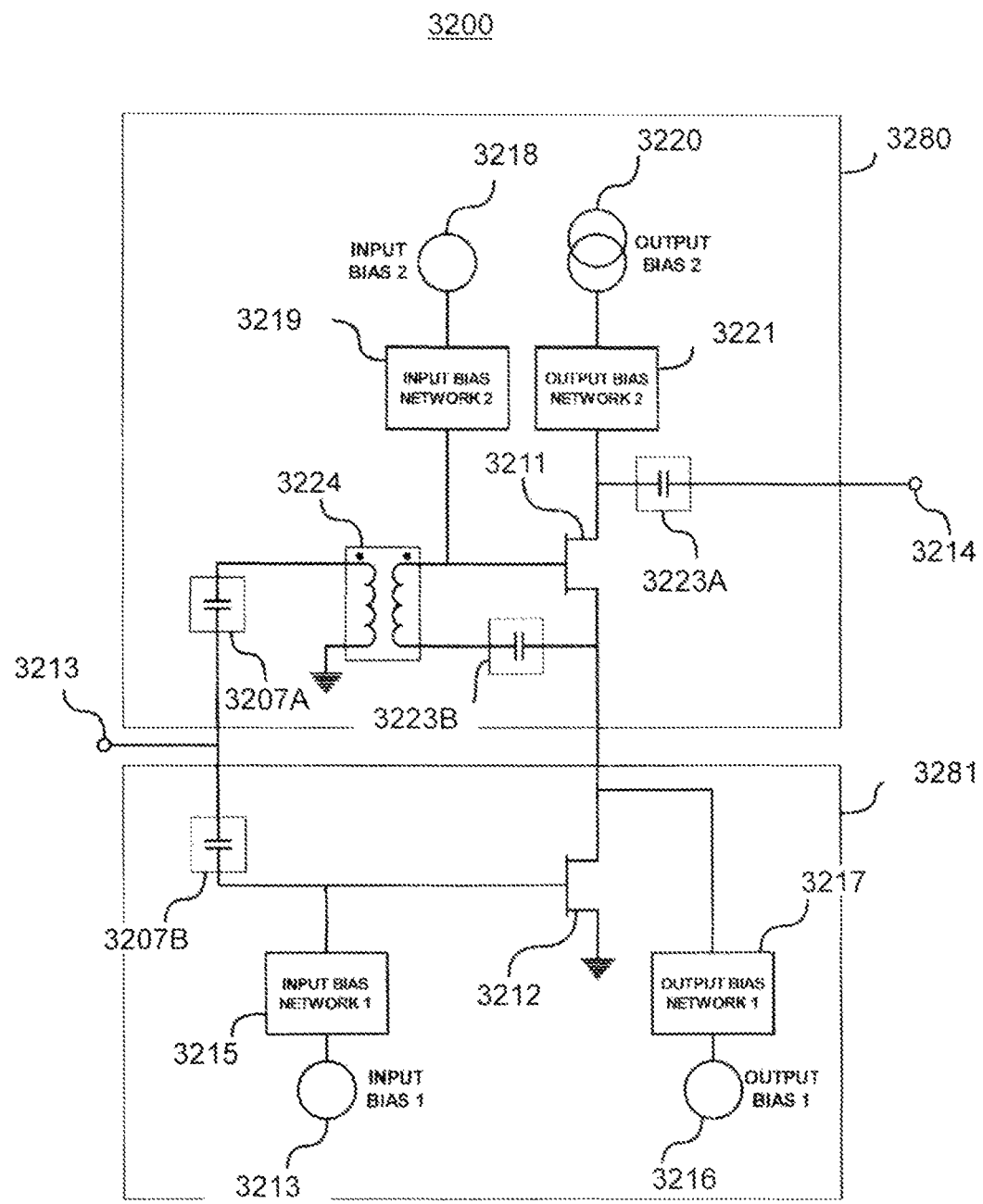
FIG. 32 shows a schematic block diagram of a dual-branch load modulated amplifier according to an embodiment of the present matter.

Referring to FIG. 32 there is shown a schematic block diagram of a dual-branch load modulated amplifier 3200 according to an embodiment of the present matter. The amplifier 3200 includes a main branch amplifier (or carrier amplifier) and an auxiliary branch amplifier (or peaking amplifier), wherein one branch may be a current-biased branch, and the other branch may be a voltage biased branch, with the branches connected in cascode configuration.

The carrier amplifier comprises a common source amplifier 3281 biased to operate in class AB, and the peaking amplifier comprises a source-floated common source amplifier 3280 biased to operate in class C*. The input RF signal applied at an input port 3213 of the amplifier is divided between the carrier amplifier 3281 and the peaking amplifier 3281. DC blocking elements 3207A and 3207B are provided in the input signal path split to the respective amplifiers The carrier amplifier 3281 is configured to amplify the input signal across all input signal power levels while the peaking amplifier 3280 is configured to amplify signals above a certain predetermined input signal power level. Below the input signal power level, the peaking amplifier 3280 behaves like a short circuit as it is biased to work in class C*. In this mode, the impedance of the load connected to the output port 3214 of the amplifier appears at the output of the carrier amplifier 3281. Above the input signal power level that the peaking amplifier 3280 is active, the input RF signal is amplified by the peaking amplifier 3280 as well as the carrier amplifier 3281 and a voltage develops at the drain-source of the peaking amplifier transistor 3211 which develops in-phase with the output voltage of the carrier amplifier 3281. These voltages sum and the result appears at the output port 3214. In this instance, the effective impedance seen by the carrier amplifier reduces to a part of the output load impedance, and a load modulation as a result of having a quasi-flat efficiency curve at back-off power.

A transformer 3224 coupled at the input of the peaking amplifier 3280 prevents leakage of the output voltage of the carrier amplifier 3281 to the input port 3213 of the amplifier 3200. In effect the output voltage of the carrier amplifier may be considered a common-mode voltage at the gate-source of the peaking amplifier transistor 3211. Different types of components may be connected to prevent leakage of common-mode voltage at the gate-source of the peaking amplifier transistor 3211 to the input port 3213. For example, these may include one or more of transformers and baluns.

The carrier amplifier 3281 is biased with a voltage source 3213 at the input through an optional input bias network 3215, and a voltage source 3216 at the output through an optional output bias network 3217. The peaking amplifier 3280 is biased with a voltage source 3218 through an optional input bias network 3219 at the input, and a current source 3220 through an optional output network 3221 at the output.

Figure 33:
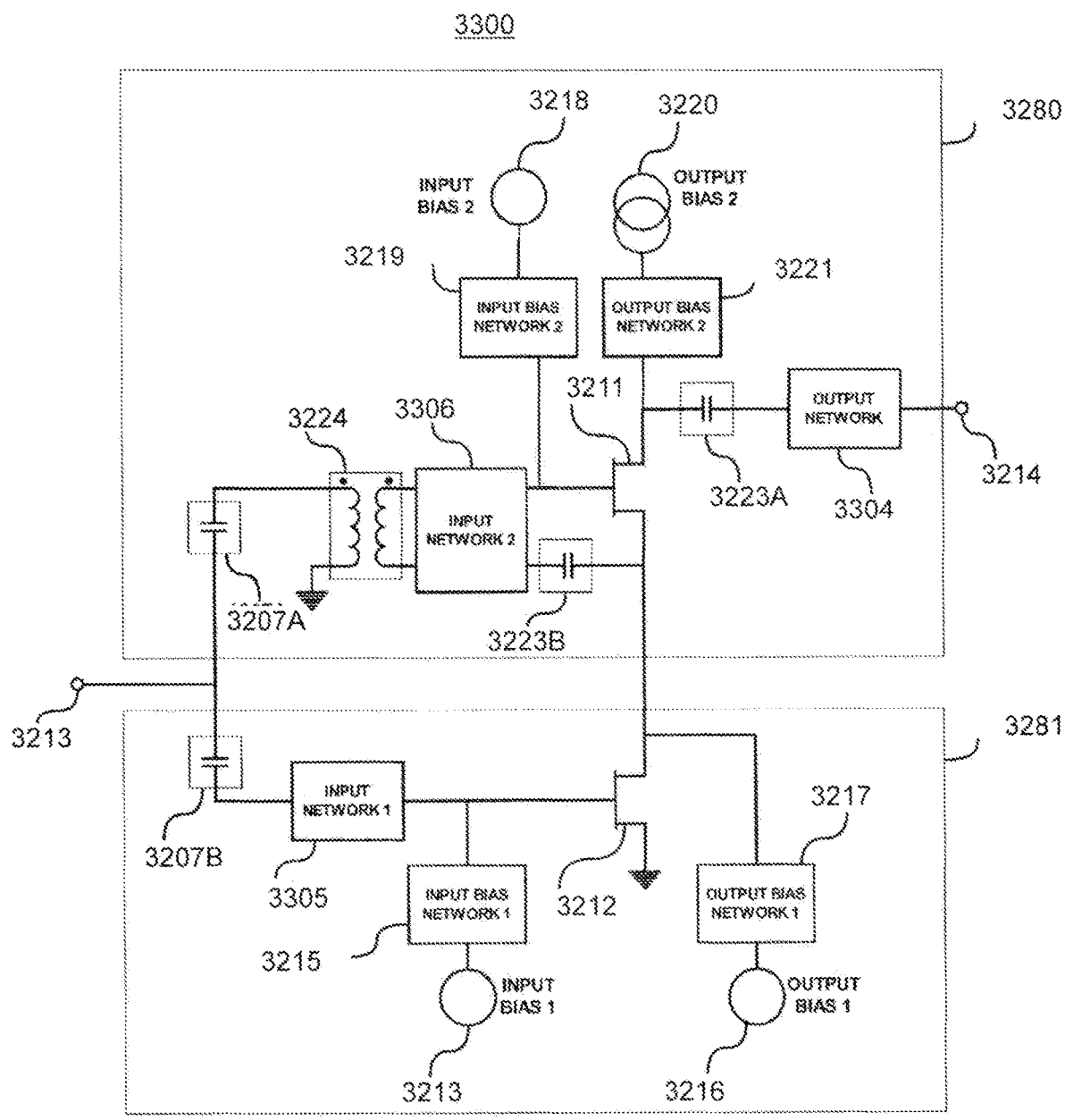
FIG. 33 shows a schematic block diagram of a cascode load modulated amplifier according to an embodiment of the present matter.

Referring to FIG. 33 there is shown a schematic block diagram 3300 of another embodiment of the cascode load modulated amplifier 3200 according to an embodiment of the present matter. The amplifier 3300 includes two input networks 3305 and 3306 have been used for matching the input of the transistors 3211 and 3212 to the characteristic impedance at the input port 3213 of the amplifier. An output network 3304 is coupled for matching the load connected to the output port 3214.

Figure 34:
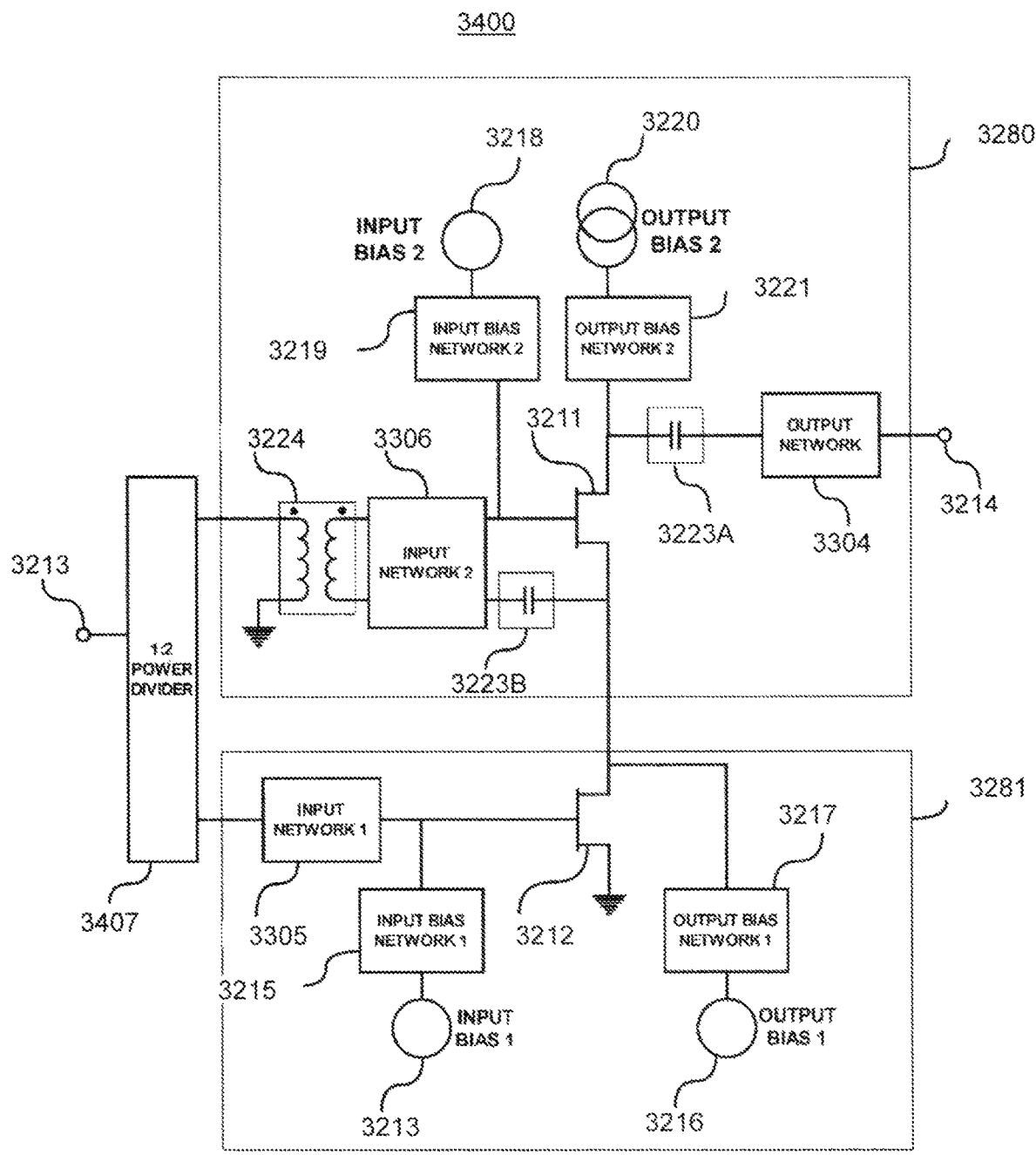
FIG. 34 shows a schematic block diagram of the cascode load modulated amplifier according to another embodiment of the present matter.

Referring to FIG. 34 there is shown a schematic block diagram 3400 of another embodiment of the cascode load modulated amplifier 3200 according to another embodiment of the present matter. The amplifier 3400, includes an input power divider 3407 coupled to the input 3213 to split the power input signal between the carrier amplifier 3281 and the peaking amplifier 3280.

In summary it may be seen from the above that current sources (capable of delivering a constant current independent of the voltage across it) used as a source of bias for power amplifiers provide many technical advantages over voltage source biased amplifiers. Furthermore, in a multi-branch high efficiency ultra-wideband amplifier which uses one current-biased transistor-based main amplifier branch and one or more transistor-based auxiliary amplifier branch(es), the present amplifier achieves high efficiency at large output power back-off levels throughout a large frequency bandwidth. In addition, high efficiency is obtained over larger power back-off ranges by increasing the number of auxiliary branches. As described earlier wideband push-pull amplifier use the same transistor technologies and types without the need for baluns or transformers at either the input or output or both. The push-pull amplifier utilizes one current-biased transistor and one voltage-biased transistor.

As various modifications could be made to the exemplary embodiments, as described above with reference to the corresponding illustrations, without departing from the scope of the invention, it is intended that all matter contained in the foregoing description and shown in the accompanying drawings shall be interpreted as illustrative rather than limiting. Thus, the breadth and scope of the present invention should not be limited by any of the above-described exemplary embodiments but should be defined in accordance with the following claims appended hereto and their equivalents.

What is claimed is:

1. An amplifier comprising:
   a main branch amplifier having a first input terminal and a first output terminal, the main branch amplifier biased to operate in class AB; and
   an auxiliary branch amplifier having a second input terminal and a second output terminal, the auxiliary amplifier biased to operate in class C, wherein one branch is a constant current-biased branch, and another branch is a voltage biased branch, with the branches connected in cascode configuration to form a load modulated amplifier with a load connected to be driven from the auxiliary amplifier output terminal under all signal conditions so that the load connected to the auxiliary amplifier output terminal appears at the main branch amplifier output when an input signal power level is below a predetermined power level.

2. The amplifier of claim 1, including output matching networks connected to the respective first and second output terminals of the main branch and auxiliary branch amplifiers.

3. The amplifier of claim 1, including an input network having a signal input port for receiving an input RF signal, the input network being configured for splitting the input RF signal applied to the input port between the main branch and auxiliary branch, wherein the input network provides an optimal input impedance to the main branch and auxiliary branch amplifiers.

4. The amplifier of claim 1, wherein the load is a multi-port antenna.

5. The amplifier of claim 1, wherein the load is an array of antenna elements.

6. The amplifier of claim 1, wherein the load includes a balun circuit having balanced ports connected to the respective outputs of the amplifiers.

7. The amplifier of claim 3, including input bias sources coupled to the input network for biasing respective input terminals of the amplifiers.

8. The amplifier of claim 2, including a current bias source for proving said constant current and a voltage bias source for providing said voltage bias, wherein said voltage source is coupled to one of said output matching networks and the current source is coupled to another of said output matching networks and wherein the respective amplifiers are biased through their respective output matching networks.

9. The amplifier of claim 1, the main branch amplifier being a common source amplifier biased to operate in class AB and the auxiliary amplifier being a source-floated common source amplifier biased to operate in class C.

10. A method for an amplifier comprising:
    biasing a main branch amplifier biased to amplify an input signal across all input signal power levels, the main branch amplifier having a first input terminal and a first output terminal;
    biasing an auxiliary branch amplifier to appear as a short circuit when operated below a predetermined power level of the input signal power level, auxiliary branch amplifier having a second input terminal and a second output terminal, wherein, one branch is a constant current-biased branch, and another branch is a voltage biased branch;
    connecting a load to be driven from the auxiliary amplifier output terminal under all signal conditions; and
    configuring the main branch amplifier and the auxiliary branch amplifier so that the load connected to the auxiliary amplifier output terminal appears at the main branch amplifier output when the input signal power level is below said predetermined power level.

11. The method of claim 10, the main branch amplifier being a common source amplifier biased to operate in class AB and the auxiliary amplifier being a source-floated common source amplifier biased to operate in class C.

\* \* \* \* \*